(12) United States Patent
Kwon et al.

(10) Patent No.: US 11,895,875 B2
(45) Date of Patent: Feb. 6, 2024

(54) DISPLAY DEVICE

(71) Applicant: SAMSUNG DISPLAY CO., LTD., Yongin-si (KR)

(72) Inventors: Won Ju Kwon, Cheonan-si (KR); Hee Seong Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 64 days.

(21) Appl. No.: 17/530,599

(22) Filed: Nov. 19, 2021

(65) Prior Publication Data

US 2022/0140034 A1  May 5, 2022

Related U.S. Application Data

(63) Continuation of application No. 16/921,271, filed on Jul. 6, 2020, now Pat. No. 11,183,548, which is a
(Continued)

(30) Foreign Application Priority Data

Sep. 13, 2016 (KR) ........................ 10-2016-0118363

(51) Int. Cl.
*H10K 59/124* (2023.01)
*H10K 59/131* (2023.01)
(Continued)

(52) U.S. Cl.
CPC ......... *H10K 59/124* (2023.02); *H10K 59/131* (2023.02); *H10K 59/352* (2023.02);
(Continued)

(58) Field of Classification Search
CPC .. H10K 59/122; H10K 59/124; H10K 59/131; H10K 59/35; H10K 59/352;
(Continued)

(56) References Cited

U.S. PATENT DOCUMENTS 7,646,148 B2   1/2010  Nagayama
9,029,838 B2   5/2015  Lim et al.
(Continued)

FOREIGN PATENT DOCUMENTS

CN    101017842    8/2007
CN    104217675    12/2014
(Continued)

OTHER PUBLICATIONS

Office Action dated Nov. 29, 2022, issued in corresponding Chinese Patent Application No. 201710821867.7.

*Primary Examiner* — Mary A Wilczewski
(74) *Attorney, Agent, or Firm* — F. CHAU & ASSOCIATES, LLC

(57) ABSTRACT

A display device includes: a substrate including a curved portion and a flat portion; an insulating layer disposed on the substrate; a first organic light emitting diode disposed on the insulating layer and having a first projection; and a second organic light emitting diode having a second projection, wherein a light emission portion is disposed in the curved portion and the flat portion, the first projection overlaps the light emission portion disposed in the curved portion and is asymmetric in the light emission portion, and the second projection overlaps the light emission portion in the flat portion and is symmetric in the light emission portion.

19 Claims, 32 Drawing Sheets

Related U.S. Application Data continuation of application No. 15/676,435, filed on Aug. 14, 2017, now Pat. No. 10,707,285.

(51) Int. Cl.
*H10K 59/35* (2023.01)
*H10K 77/10* (2023.01)
*H10K 50/813* (2023.01)
*H10K 50/822* (2023.01)
*H10K 59/122* (2023.01)
*H10K 102/00* (2023.01)

(52) U.S. Cl.
CPC ......... *H10K 59/353* (2023.02); *H10K 77/111* (2023.02); *H10K 50/813* (2023.02); *H10K 50/822* (2023.02); *H10K 59/122* (2023.02); *H10K 2102/3026* (2023.02); *H10K 2102/311* (2023.02)

(58) Field of Classification Search
CPC .............. H10K 50/813; H10K 77/111; H10K 2102/3026; H10K 2102/311; H10K 2102/351; H19K 50/822; Y02E 10/549; Y02P 70/50; H01L 33/24
See application file for complete search history.

(56) References Cited

U.S. PATENT DOCUMENTS

| | | | |
|---|---|---|---|
| 9,076,739 B2 | 7/2015 | Choi | |
| 9,117,783 B2 | 8/2015 | Jin | |
| 9,130,192 B2 | 9/2015 | Kim et al. | |
| 9,349,969 B2 | 5/2016 | Kwon et al. | |
| 9,423,162 B2 | 8/2016 | Roll et al. | |
| 9,490,301 B2 | 11/2016 | Yi | |
| 9,504,125 B2 | 11/2016 | Amelung et al. | |
| 9,515,099 B2 | 12/2016 | Kwon et al. | |
| 9,521,770 B2 | 12/2016 | Li | |
| 9,559,329 B2 | 1/2017 | Lee | |
| 9,577,208 B2 | 2/2017 | Lee et al. | |
| 9,583,739 B2 | 2/2017 | Hirakata et al. | |
| 9,608,050 B2 | 3/2017 | Jin | |
| 9,614,015 B2 | 4/2017 | Park et al. | |
| 9,620,570 B2 | 4/2017 | Koo et al. | |
| 9,660,217 B2 | 5/2017 | Fukuda et al. | |
| 9,673,421 B2 | 6/2017 | Sun | |
| 9,774,003 B2 | 9/2017 | Naraoka | |
| 9,837,629 B2 | 12/2017 | Yun et al. | |
| 9,905,793 B1 | 2/2018 | Peng et al. | |
| 9,923,162 B2 | 3/2018 | So et al. | |
| 9,929,222 B2 | 3/2018 | Lim et al. | |
| 9,939,699 B2 | 4/2018 | Park et al. | |
| 9,978,814 B2 | 5/2018 | Jang et al. | |
| 9,978,819 B2 | 5/2018 | Jang et al. | |
| 9,991,320 B2 | 6/2018 | Joung et al. | |
| 10,008,697 B2 | 6/2018 | Jang et al. | |
| 10,069,114 B2 | 9/2018 | Hirakata | |
| 10,186,675 B2 | 1/2019 | Dai et al. | |
| 10,248,159 B2 | 4/2019 | Jin et al. | |
| 10,326,097 B1 | 6/2019 | Xia et al. | |
| 10,342,124 B2 | 7/2019 | Jikumaru et al. | |
| 10,347,871 B2 | 7/2019 | Joung et al. | |
| 10,424,761 B2 | 9/2019 | Choi et al. | |
| 10,522,604 B2 | 12/2019 | Jin | |
| 10,707,285 B2 * | 7/2020 | Kwon | H10K 59/131 |
| 11,183,548 B2 * | 11/2021 | Kwon | H10K 59/131 |
| 2007/0182322 A1 * | 8/2007 | Nagayama | H10K 59/122 313/506 |
| 2010/0060148 A1 | 3/2010 | Hwang et al. | |
| 2011/0012139 A1 | 1/2011 | Yamamoto | |
| 2011/0297943 A1 | 12/2011 | Kim et al. | |
| 2012/0249465 A1 | 10/2012 | Lin et al. | |
| 2014/0045283 A1 | 2/2014 | Hirakata et al. | |
| 2014/0103308 A1 | 4/2014 | Choi et al. | |
| 2014/0139984 A1 | 5/2014 | Jang | |
| 2014/0231763 A1 | 8/2014 | Kim | |
| 2014/0232956 A1 | 8/2014 | Kwon et al. | |
| 2014/0239276 A1 | 8/2014 | Lin et al. | |
| 2014/0306241 A1 | 10/2014 | Hirakata et al. | |
| 2014/0312319 A1 | 10/2014 | Kim | |
| 2014/0313746 A1 | 10/2014 | Song et al. | |
| 2014/0332762 A1 | 11/2014 | Kim et al. | |
| 2014/0346474 A1 | 11/2014 | Jeong et al. | |
| 2014/0353595 A1 * | 12/2014 | Choi | H10K 59/00 257/40 |
| 2014/0353629 A1 * | 12/2014 | Jin | H10K 59/131 257/40 |
| 2014/0362126 A1 | 12/2014 | Jeong et al. | |
| 2015/0041765 A1 | 2/2015 | Ahn et al. | |
| 2015/0053943 A1 | 2/2015 | Cho et al. | |
| 2015/0108439 A1 | 4/2015 | Kim et al. | |
| 2015/0189768 A1 | 7/2015 | Kishida et al. | |
| 2015/0192731 A1 | 7/2015 | Kim et al. | |
| 2015/0228927 A1 | 8/2015 | Kim | |
| 2015/0263314 A1 | 9/2015 | Sakuishi et al. | |
| 2015/0340656 A1 | 11/2015 | So et al. | |
| 2015/0362776 A1 | 12/2015 | Jikumaru et al. | |
| 2015/0380466 A1 | 12/2015 | Koo et al. | |
| 2016/0062184 A1 | 3/2016 | Wu et al. | |
| 2016/0079333 A1 | 3/2016 | Shishido et al. | |
| 2016/0079336 A1 | 3/2016 | Youn et al. | |
| 2016/0085125 A1 | 3/2016 | Park et al. | |
| 2016/0141528 A1 | 5/2016 | Masuyama et al. | |
| 2016/0155784 A1 | 6/2016 | Park | |
| 2016/0155787 A1 | 6/2016 | Lee | |
| 2016/0155983 A1 | 6/2016 | Lee et al. | |
| 2016/0172623 A1 * | 6/2016 | Lee | H10K 59/131 257/40 |
| 2016/0188197 A1 | 6/2016 | Ryu et al. | |
| 2016/0211308 A1 | 7/2016 | Lee | |
| 2016/0211313 A1 | 7/2016 | Kim et al. | |
| 2016/0225838 A1 | 8/2016 | Im | |
| 2016/0231783 A1 | 8/2016 | Raff et al. | |
| 2016/0234362 A1 | 8/2016 | Moon et al. | |
| 2016/0254479 A1 | 9/2016 | Jeong et al. | |
| 2016/0268524 A1 | 9/2016 | Suzuki et al. | |
| 2016/0268542 A1 | 9/2016 | Suzuki | |
| 2016/0285029 A1 | 9/2016 | Jeon et al. | |
| 2016/0293869 A1 | 10/2016 | Saeki et al. | |
| 2016/0313488 A1 | 10/2016 | Chang et al. | |
| 2016/0329520 A1 | 11/2016 | Namkung et al. | |
| 2016/0336523 A1 | 11/2016 | Kwon et al. | |
| 2016/0338188 A1 | 11/2016 | Dighde et al. | |
| 2017/0003737 A1 | 1/2017 | Wang et al. | |
| 2017/0005286 A1 | 1/2017 | Yun et al. | |
| 2017/0033315 A1 | 2/2017 | Jang et al. | |
| 2017/0052623 A1 | 2/2017 | Park et al. | |
| 2017/0062528 A1 | 3/2017 | Aoyama et al. | |
| 2017/0062537 A1 | 3/2017 | Kim et al. | |
| 2017/0062741 A1 | 3/2017 | Shin | |
| 2017/0062770 A1 | 3/2017 | Jang et al. | |
| 2017/0092705 A1 | 3/2017 | Lim et al. | |
| 2017/0094785 A1 | 3/2017 | Sun et al. | |
| 2017/0098794 A1 | 4/2017 | Cho et al. | |
| 2017/0117501 A1 | 4/2017 | Choi et al. | |
| 2017/0125738 A1 | 5/2017 | Kim et al. | |
| 2017/0125741 A1 | 5/2017 | Ishida et al. | |
| 2017/0125742 A1 | 5/2017 | Park et al. | |
| 2017/0155087 A1 | 6/2017 | Lee et al. | |
| 2017/0179423 A1 | 6/2017 | Kwon et al. | |
| 2017/0179433 A1 | 6/2017 | Nam | |
| 2017/0221974 A1 | 8/2017 | Kimura et al. | |
| 2017/0237025 A1 | 8/2017 | Choi et al. | |
| 2017/0278901 A1 | 9/2017 | Kim et al. | |
| 2017/0287997 A1 | 10/2017 | Park | |
| 2017/0308196 A1 | 10/2017 | Jeong et al. | |
| 2017/0323779 A1 | 11/2017 | Um et al. | |
| 2017/0352692 A1 | 12/2017 | Lee et al. | |
| 2017/0365649 A1 | 12/2017 | Kim et al. | |
| 2017/0367173 A1 | 12/2017 | Park et al. | |
| 2018/0018907 A1 | 1/2018 | Kim et al. | |
| 2018/0019293 A1 | 1/2018 | Choi et al. | |
| 2018/0039352 A1 | 2/2018 | Wu et al. | |

(56) References Cited

U.S. PATENT DOCUMENTS

| | | |
|---|---|---|
| 2018/0053917 A1 | 2/2018 | Isaka et al. |
| 2018/0076270 A1 | 3/2018 | Kwon et al. |
| 2018/0081481 A1 | 3/2018 | Fournier et al. |
| 2018/0090702 A1 | 3/2018 | Um et al. |
| 2018/0093464 A1 | 4/2018 | Lee et al. |
| 2018/0132371 A1 | 5/2018 | Yeum et al. |
| 2018/0166019 A1 | 6/2018 | Lee et al. |
| 2018/0166652 A1 | 6/2018 | Kim et al. |
| 2018/0175327 A1 | 6/2018 | Jang et al. |
| 2018/0182839 A1 | 6/2018 | Lee et al. |
| 2018/0190719 A1 | 7/2018 | Kim et al. |
| 2018/0190923 A1 | 7/2018 | Heo et al. |
| 2018/0211587 A1 | 7/2018 | Yu et al. |
| 2018/0225500 A1 | 8/2018 | Han |
| 2018/0247980 A1 | 8/2018 | Jang et al. |
| 2018/0301656 A1 | 10/2018 | Ji |
| 2018/0337224 A1 | 11/2018 | Aoki |
| 2018/0351128 A1 | 12/2018 | Lang |
| 2018/0366664 A1 | 12/2018 | Fujioka et al. |
| 2018/0373085 A1 | 12/2018 | Wilson et al. |
| 2018/0375044 A1 | 12/2018 | Sasabayashi |
| 2019/0006626 A1 | 1/2019 | Kim et al. |
| 2019/0019966 A1 | 1/2019 | Jiang et al. |
| 2019/0043418 A1 | 2/2019 | Rieutort-Louis et al. |
| 2019/0074331 A1 | 3/2019 | Oh et al. |
| 2019/0074332 A1 | 3/2019 | Kim et al. |
| 2019/0081264 A1 | 3/2019 | Yun et al. |
| 2019/0096976 A1 | 3/2019 | Jang et al. |
| 2019/0103442 A1 | 4/2019 | Choi et al. |
| 2019/0131580 A1 | 5/2019 | Youn et al. |
| 2019/0131581 A1 | 5/2019 | Choi et al. |
| 2019/0165301 A1 | 5/2019 | Kim et al. |
| 2019/0165318 A1 | 5/2019 | Choi et al. |
| 2019/0165323 A1 | 5/2019 | Jo et al. |
| 2019/0189966 A1 | 6/2019 | Jang et al. |
| 2019/0243488 A1 | 8/2019 | Jeong et al. |
| 2019/0280247 A1 | 9/2019 | Joung et al. |
| 2019/0334105 A1 | 10/2019 | Choi et al. |
| 2019/0393284 A1 | 12/2019 | Li et al. |
| 2019/0393448 A1 | 12/2019 | Choi et al. |
| 2020/0058708 A1 | 2/2020 | Jang et al. |
| 2020/0365776 A1 | 11/2020 | Sim et al. |
| 2020/0411620 A1 | 12/2020 | Kwon et al. |
| 2021/0217818 A1 | 7/2021 | Jang et al. |
| 2022/0140034 A1* | 5/2022 | Kwon .................. H10K 77/111 257/40 |

FOREIGN PATENT DOCUMENTS

| | | |
|---|---|---|
| CN | 104218050 | 12/2014 |
| CN | 206322696 | 7/2017 |
| DE | 102008031531 | 1/2010 |
| JP | 2015-207545 | 11/2015 |
| KR | 102006080638 | 7/2006 |
| KR | 10-0700013 | 3/2007 |
| KR | 1020140124614 | 10/2014 |
| KR | 1020150003572 | 1/2015 |
| KR | 1020150055259 | 5/2015 |
| KR | 1020150057739 | 5/2015 |
| WO | 2015-166708 | 11/2015 |

* cited by examiner

DISPLAY DEVICE

CROSS-REFERENCE TO RELATED APPLICATIONS

This application is a continuation of U.S. patent application Ser. No. 16/921,271 filed on Jul. 6, 2020, which is a continuation of U.S. patent application Ser. No. 15/676,435 filed on Aug. 14, 2017, now U.S. Pat. No. 10,707,285 issued on Jul. 7, 2020, which claims priority under 35 U.S.C. § 119 to Korean Patent Application No. 10-2016-0118363 filed in the Korean Intellectual Property Office on Sep. 13, 2016, the disclosures of which are incorporated by reference herein in their entireties.

(a) TECHNICAL FIELD

The present invention relates to a display device.

(b) DESCRIPTION OF THE RELATED ART

An organic light emitting diode (OLED) display displays an image by using light that is emitted from a plurality of OLEDs. In a pixel area on a substrate of the OLED display, there is a provided an OLED and a pixel circuit.

When the OLED display uses a polymer film as a substrate, the OLED display may be flexible. Such a flexible OLED display may include a curved portion and a flat portion. For example, the curved portion may be connected to at least one edge of the flat portion.

When the OLED emits white light, a white characteristic of light observed from the front thereof is different from that of light observed from the side thereof. This may be referred to as white angle difference (WAD). WAD serves as a factor for evaluating a variation of the white characteristic at certain viewing angles. For example, WAD is determined by measuring and evaluating levels of luminance variations and color coordinate variations at certain viewing angles and comparing them with those perpendicular to the front of the screen.

Users generally watch screens at the center and in front thereof. Accordingly, when the curved portion is located at an edge of the flat portion, users see light emitted from the flat portion toward the front of the screen and light emitted from the curved portion emitted toward the side of the screen. In this case, the light emitted from the curved portion has a different white characteristic from the light emitted from the flat portion, thereby resulting in a difference in color quality. In other words, the color quality of light emitted from the curved portion observed from a central and frontal region of the screen is less than that of light emitted the flat portion.

SUMMARY

A display device according to an exemplary embodiment of the present invention includes: a substrate including a curved portion and a flat portion; an insulating layer disposed on the substrate; a first organic light emitting diode disposed on the insulating layer and having a first projection; and a second organic light emitting diode having a second projection, wherein a light emission portion is formed in the curved portion and the flat portion, the first projection overlaps the light emission portion in the curved portion and is asymmetric in the light emission portion, and the second projection overlaps the light emission portion in the flat portion and is symmetric in the light emission portion.

The display device may further include a wiring layer disposed between the substrate and the insulating layer and disposed in the curved portion and the flat portion, wherein the wiring layer disposed in the curved portion may overlap the first projection, and the wiring layer disposed in the flat portion may overlap the second projection.

The light emission portion disposed in the curved portion may include a first light emission portion corresponding to a red pixel, a second light emission portion corresponding to a green pixel, and a third light emission portion corresponding to a blue pixel, and the first projection may overlap the first light emission portion and the third light emission portion and may be asymmetric in the first light emission portion and the third light emission portion.

The first projection may overlap the second light emission portion, and may be asymmetric in the second light emission portion.

The light emission portion disposed in the curved portion may include a first light emission portion corresponding to a red pixel, a second light emission portion corresponding to a green pixel, and a third light emission portion corresponding to a blue pixel, and the first projection may overlap the first light emission portion and the third light emission portion, may be asymmetrically disposed in one of the first light emission portion and the third light emission portion, and may be symmetrically disposed in the other of the first light emission portion and the third light emission portion.

The wiring layer may include a data line and a driving voltage line, and a space between the data line and the driving voltage line in the first light emission portion may be different from a space between the data line and the driving voltage line in the third light emission portion.

The wiring layer may include a data line and a driving voltage line, a space between the data line and the driving voltage line in the first light emission portion may be the same as a space between the data line and the driving voltage line in the third light emission portion, and the first light emission portion and the third light emission portion may deviate from each other with respect to a vertical axis.

The light emission portion disposed in the curved portion may include a first light emission portion corresponding to a red pixel, a second light emission portion corresponding to a green pixel, and a third light emission portion corresponding to a blue pixel, the first projection may overlap the first light emission portion, the second light emission portion, and the third light emission portion, the first projection may be symmetrically disposed in the first light emission portion and the third light emission portion, and the first projection may be asymmetrically disposed in the second light emission portion.

The insulating layer may be in contact with an upper surface of the wiring layer.

The thickness of the insulating layer may be 15,000 angstroms or less.

The first projection may be biased in a direction moving away from the flat portion toward the curved portion.

A display device according to an exemplary embodiment of the present invention includes: a substrate including a curved portion and a flat portion; an insulating layer disposed on the substrate; and an organic light emitting diode disposed on the insulating layer in the curved portion and having a projection, wherein a light emission portion is disposed in the curved portion, the projection overlapping the light emission portion is asymmetrically disposed in the light emission portion, and the projection in the light emission portion is biased in a direction moving away from the flat portion toward the curved portion.

The display device may further include a wiring layer disposed between the substrate and the insulating layer and disposed in the curved portion, wherein the wiring layer overlaps the projection.

The light emission portion may include a first light emission portion corresponding to a red pixel, a second light emission portion corresponding to a green pixel, and a third light emission portion corresponding to a blue pixel, the wiring layer may include a first wiring layer overlapping the first light emission portion and the third light emission portion and a second wiring layer overlapping the second light emission portion, and the first wiring layer may overlap the first light emission portion and the third light emission portion and may be asymmetrically disposed in the first light emission portion and the third light emission portion.

The second wiring layer may be asymmetrically disposed in the second light emission portion.

The light emission portion may include a first light emission portion corresponding to a red pixel, a second light emission portion corresponding to a green pixel, and a third light emission portion corresponding to a blue pixel, the wiring layer may overlap the first light emission portion and the third light emission portion, the wiring layer may be asymmetrically disposed in one of the first light emission portion and the third light emission portion, and the wiring layer may be symmetrically disposed in the other of the first light emission portion and the third light emission portion.

The wiring layer may include a data line and a driving voltage line, and a space between the data line and the driving voltage line in the first light emission portion may be different from a space between the data line and the driving voltage line in the third light emission portion.

The wiring layer may include a data line and a driving voltage line, a space between the data line and the driving voltage line in the first light emission portion may be the same as a space between the data line and the driving voltage line in the third light emission portion, and the first light emission portion and the third light emission portion may deviate from each other with respect to a vertical axis.

The light emission portion may include a first light emission portion corresponding to a red pixel, a second light emission portion corresponding to a green pixel, and a third light emission portion corresponding to a blue pixel, the projection may overlap the first light emission portion, the second light emission portion, and the third light emission portion, the projection may be disposed to be symmetric in the first light emission portion and the third light emission portion, and the projection may be asymmetrically disposed in the second light emission portion.

The light emission portion may include a first light emission portion corresponding to a red pixel, a second light emission portion corresponding to a green pixel, and a third light emission portion corresponding to a blue pixel, and the second light emission portion may be smaller than the first light emission portion and the third light emission portion.

According to an exemplary embodiment of the present invention there is provided a display device including: a substrate including a curved portion and a flat portion; an insulating layer disposed on the substrate; a pixel electrode disposed on the insulating layer and having a first projection and a second projection; and a wiring layer disposed between the substrate and the insulating layer and overlapped with the first and second projections, wherein one of the first and second projections is biased in a direction that moves away from a center of a light emission portion.

DETAILED DESCRIPTION OF THE EMBODIMENTS

Figure 1:
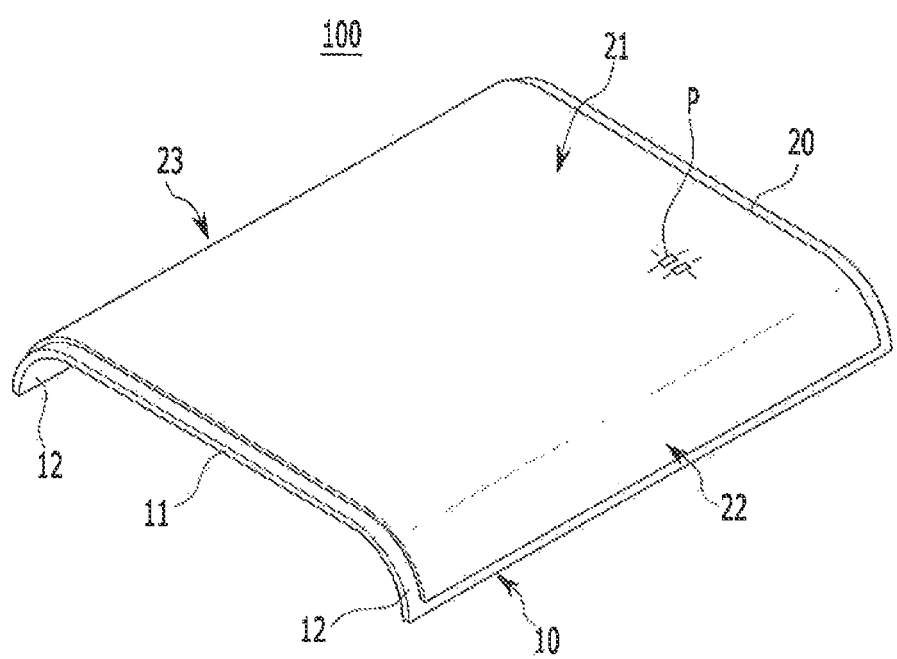
FIG. 1 is a perspective view schematically showing an organic light emitting diode (OLED) display in accordance with an exemplary embodiment of the present invention.

Exemplary embodiments of the present invention will be described more fully hereinafter with reference to the accompanying drawings. As those skilled in the art would realize, the described embodiments may be modified in various different ways, and thus, should not be limited to the embodiments set forth herein.

The same elements may be referred to with the same reference numerals throughout the specification.

In the drawings, the thickness of layers, films, panels, regions, etc., may be exaggerated for clarity.

It will also be understood that when an element such as a layer, film, area, or plate is referred to as being "on" another element, it can be directly on the other element, or one or more intervening element may also be present.

Further, in the specification, the phrase "on a plane" may mean to view an object portion from the top, and the phrase "on a cross-section" may mean to view a cross-section of the object portion which is vertically cut from the side.

Figure 2:
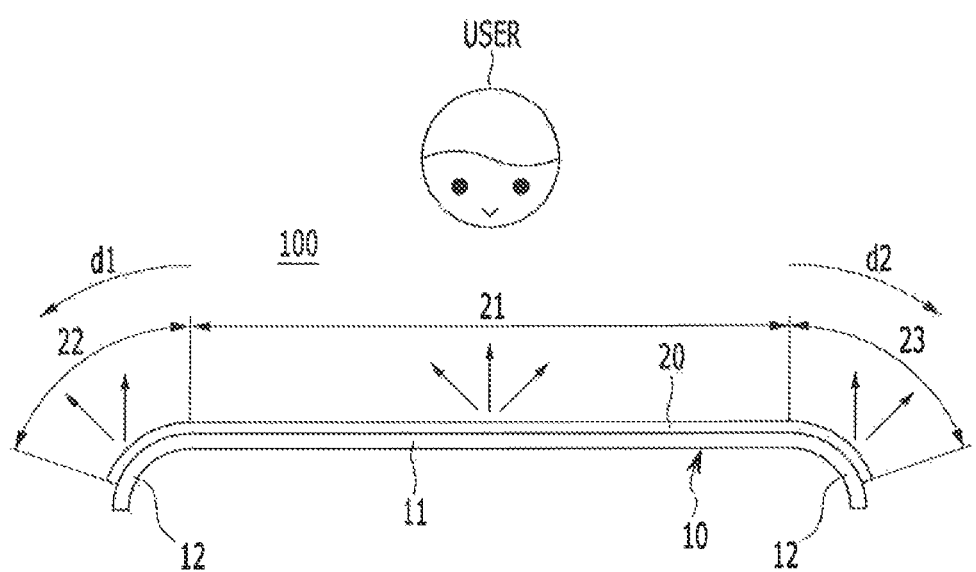
FIG. 2 is a cross-sectional view of the OLED display shown in FIG. 1 according to an exemplary embodiment of the present invention.

FIG. 1 is a perspective view schematically showing an organic light emitting diode (OLED) display in accordance with an exemplary embodiment of the present invention. FIG. 2 is a cross-sectional view of the OLED display shown in FIG. 1 according to an exemplary embodiment of the present invention.

Referring to FIG. 1 and FIG. 2, an OLED display 100 according to an exemplary embodiment of the present invention includes a substrate 10 and a display unit 20 including a plurality of pixels P on the substrate 10 for displaying an image.

The substrate 10 is made of a flexible material such as a polymer film, and at least a part of the substrate 10 is bent to form a curved portion 12. The substrate 10 may include a flat portion 11 and the curved portion 12 connected to at least one edge of the flat portion 11. For example, the substrate 10 may include the flat portion 11 and a pair of curved portions 12 respectively connected to a left side and a right side or an upper side and a lower side of the flat portion 11. The two curved portions 12 may have the same curvature, and centers of curvatures of the two curved portions 12 may be located at the same side. In FIG. 1 and FIG. 2, a case in which the pair of curved portions 12 is bent downwardly and connected to the left side and the right side of the flat portion 11 is illustrated as an example.

The display unit 20 is bent along with the substrate 10, and includes a front display unit 21 for displaying the image on a front surface thereof. The display unit 20 further includes bending display units 22 and 23 that are bent at right and left sides of the front display unit 21 for displaying the image on a side surface thereof. Hereinafter, it will be described that the display unit disposed at the left side is referred to as a left bending display unit 22 and the display unit disposed at the right side is referred to as a right bending display unit 23. In the present invention, the left side and the right side are defined as such for convenience, however, the left side and the right side may be changed depending on the viewing angle of reference. For example, an upper side and a lower side may be the left side and the right side, respectively.

The plurality of pixels P may be formed in the front display unit 21 and the bending display unit 22 and 23 on the flat portion 11 and the curved portion 12. The pixels P may have the same pattern. Each pixel P may be a minimum light emitting unit for displaying the image. The pixel P is configured of a pixel circuit and an OLED of which light emission is controlled by the pixel circuit.

For example, the OLED display 100 according to an exemplary embodiment of the present invention consists of the front display unit 21 and the bending display units 22 and 23 to minimizes a dead space in which the image is not shown, thereby maximizing the amount of space on which to display the image. In other words, the size of the display unit 20 is increased.

The display unit 20 may be covered and sealed by a thin film encapsulation layer. The thin film encapsulation layer suppresses deterioration of the OLED caused by moisture and oxygen contained in external air.

Users' eyes are typically located at the center and in front of the display unit 20 when viewing images on the display unit 20. Since the curve portion 12 is bent with a predetermined curvature at an edge of the flat portion 11, the users see light emitted from the flat portion 11 toward the front thereof and light emitted from the curved portion 12 toward the side thereof. In this case, the light emitted from the bending display units 22 and 23 toward the side has a white characteristic different from the light emitted from the front display unit 21 toward the front. In other words, a color quality difference is generated. This color quality difference may worsen due to a step of a wiring layer in a high resolution application. The area of the light emission portion is wide before the high resolution application such that a luminance or color change non-uniformity has a negligible level although the step increases. However, the luminance difference or the color change is largely visible even if there is only a small flexion of the display unit 21 while in the high resolution application, since the light emission portion area becomes narrow.

The OLED display 100 according to an exemplary embodiment of the present invention positions the wiring layer on the substrate 10 to reduce an angle of the light emitted from the curved portion to the side, thereby increasing a WAD characteristic. Hereinafter, various exemplary embodiments describing the position of the wiring layer in the light emission portion will be provided.

Figure 3:
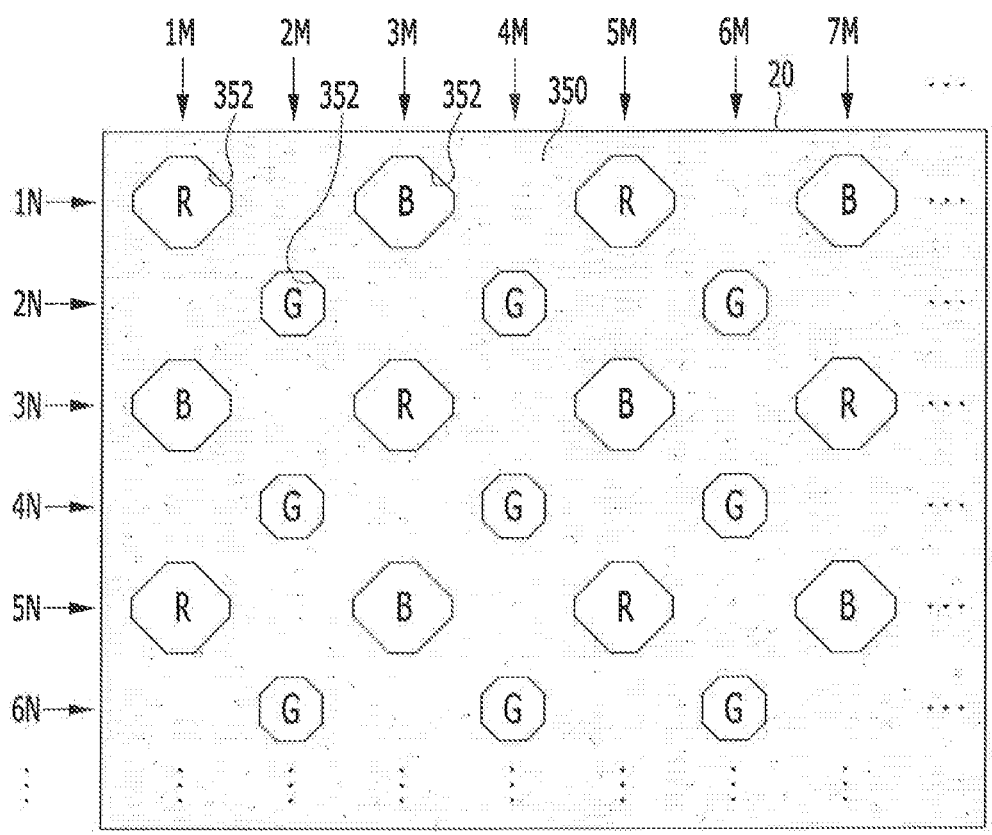
FIG. 3 is a layout view schematically showing a plurality of pixels of an OLED display according to an exemplary embodiment of the present invention.

FIG. 3 is a layout view schematically showing a plurality of pixels of an OLED display according to an exemplary embodiment of the present invention.

Referring to FIG. 3, the display unit 20 includes a pixel definition layer 350 having an opening 352. The OLED is formed in the opening 352, and light is emitted from the OLED such the opening 352 corresponds to a region defining a light emission portion.

In the present exemplary embodiment, a first light emission portion corresponding to a red pixel R and a third light emission portion corresponding to a blue pixel B are alternately disposed in a first row 1N, and a plurality of second light emission portions corresponding to a green pixel G are disposed to be separated by a predetermined interval in a second row 2N adjacent to the first row 1N. The third light emission portion corresponding to the blue pixel B and the first light emission portion corresponding to the red pixel R are alternately disposed in a third row 3N adjacent to the second row 2N, while a plurality of second light emission portions corresponding to the green pixel G are disposed to be separated with a predetermined interval in a fourth row 4N adjacent to the third row 3N. As shown in a fifth row 5N and a sixth row 6N, and the arrangement of the pixels and the light emission portions may be repeated. In this case, the first light emission portion corresponding to the red pixel R and the third light emission portion corresponding to the blue pixel B may be formed to be larger than the second light emission portion corresponding to the green pixel G.

The first light emission portion corresponding to the red pixel R disposed in the first row 1N and the third light emission portion corresponding to the blue pixel B disposed in the first row 1N, and the second light emission portion corresponding to the green pixel G disposed in the second row 2N are alternately disposed. Accordingly, the first light emission portion corresponding to the red pixel R and the third light emission portion corresponding to the blue pixel B are alternately disposed in a first column 1M, and the plurality of second light emission portions corresponding to the green pixel G are disposed to be separated with a predetermined interval in a second column 2M adjacent to the first column 1M. Similarly, the third light emission portion corresponding to the blue pixel B and the first light emission portion corresponding to the red pixel R are alternately disposed in the third column 3M adjacent to the second column 2M, and the plurality of second light emission portions corresponding to the green pixel G are disposed to be separated with a predetermined interval in the fourth column 4M adjacent to the third column 3M. As can be seen from columns 4M, 5M, 6M and 7M in FIG. 3, the arrangement of the pixels and the light emission portions may be repeated.

This pixel arrangement structure is referred to as a pentile matrix. In such a structure, high resolution images may be realized by pixels of a small number by applying rendering driving for displaying a color and sharing an adjacent pixel.

Figure 4:
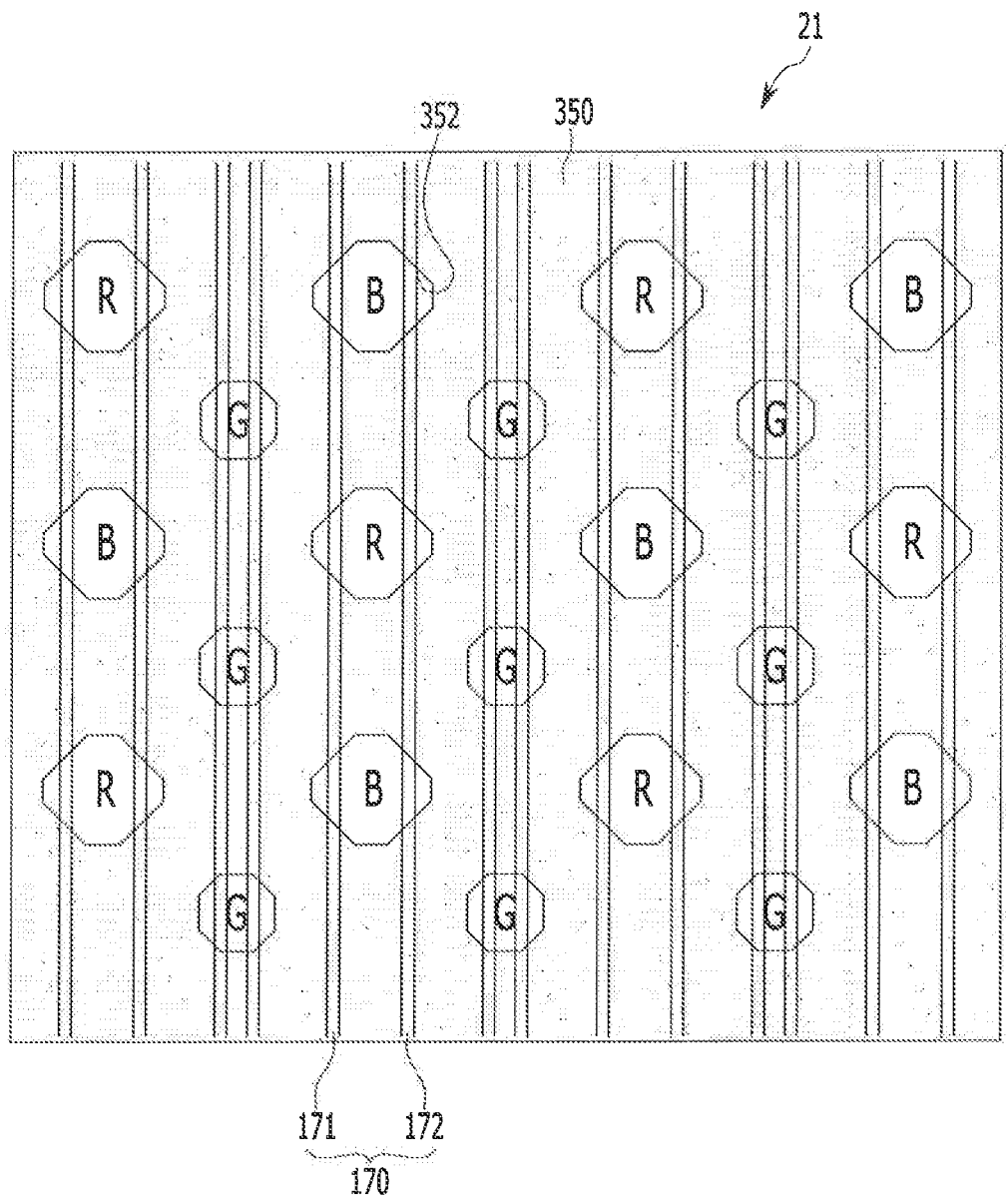
FIG. 4 is a layout view schematically showing a plurality of pixels and a wiring layer in a front display unit of an OLED display according to an exemplary embodiment of the present invention.
Figure 5:
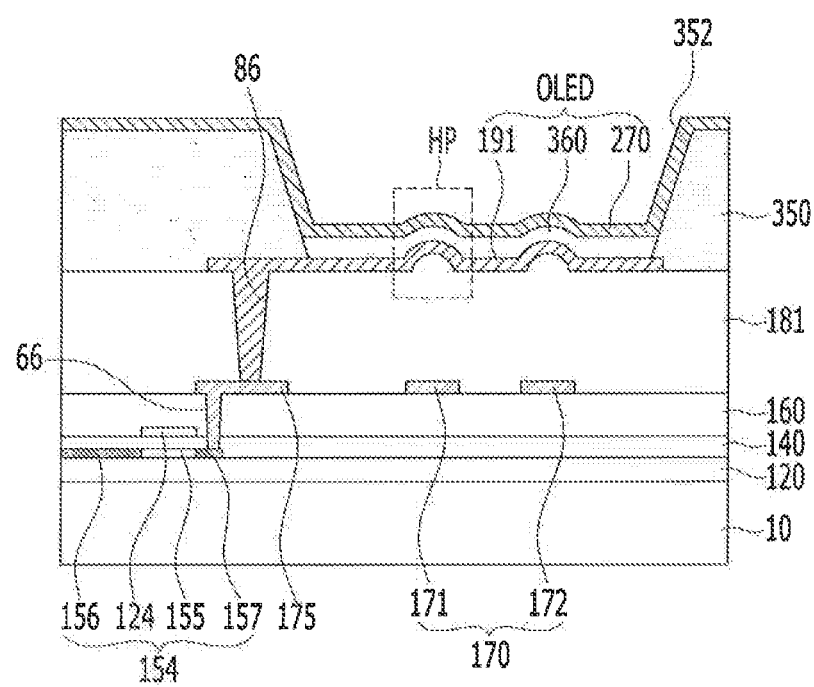
FIG. 5 is a cross-sectional view of a part of one pixel among a plurality of pixels shown in FIG. 4 according to an exemplary embodiment of the present invention.

FIG. 4 is a layout view schematically showing a plurality of pixels and a wiring layer in a front display unit of an OLED display according to an exemplary embodiment of the present invention. FIG. 5 is a cross-sectional view of a part of one pixel among a plurality of pixels shown in FIG. 4 according to an exemplary embodiment of the present invention.

Referring to FIG. 4, on the front display unit 21, the first light emission portion, the second light emission portion, and the third light emission portion that respectively correspond to the red pixel R, the green pixel G, and the blue pixel B are disposed in the opening 352 of the pixel definition layer 350. In the front display unit 21 disposed on the flat portion of the substrate, a plurality of wiring layers 170 passing through the light emission portions are formed, and the wiring layers 170 may include a data line 171 and a driving voltage line 172. In the front display unit 21, the wiring layers 170 may overlap the first light emission portion, the second light emission portion, and the third light emission portion, and the wiring layers 170 may be symmetrically disposed in each light emission portion. In other words, a region that includes the wiring layer 170 may have a symmetric shape in the opening 352.

Referring to FIG. 5, the OLED display according to the present exemplary embodiment includes insulating layers, elements, and electrodes to form the OLED display disposed on the substrate 10.

The substrate 10 may be made of a flexible material such as polyimide, polyethylene terephthalate, polyether sulfone, polyacrylate, polyethylene naphthalate, polyphenylene sulfide, triacetyl cellulose, and the like. However, it is not limited thereto.

A buffer layer 120 for preventing penetration of an impurity and providing planarization of a surface may be disposed on the substrate 10. The buffer layer 120 may be formed of a material such as silicon nitride, silicon oxide, or silicon oxynitride, however the buffer layer 120 may be omitted depending on a type and/or a process condition of the substrate 10.

A light emission control channel 155, and a light emission control source electrode 156 and a light emission control drain electrode 157 at respective sides of the light emission control channel 155, are disposed on the buffer layer 120. A gate insulating layer 140 is disposed on the buffer layer 120, and a light emission control gate electrode 124 is disposed on the gate insulating layer 140. An interlayer insulating layer 160 is disposed on the light emission control gate electrode 124. The interlayer insulating layer 160 may be formed of silicon nitride, silicon oxide, or the like.

The light emission control gate electrode 124, the light emission control source electrode 156, the light emission control drain electrode 157, and the light emission control channel 155 form a light emission control transistor 154. FIG. 5 only shows the light emission control transistor 154, however the light emission control transistor 154 may be connected to a driving transistor. In addition, the OLED display according to the present exemplary embodiment may include a switching transistor, a compensation transistor, an initialization transistor, an operation control transistor, and a bypass transistor, and may also include a plurality of capacitors and scan lines. The present exemplary embodiment is not limited thereto, and a number of the transistors and a number of the capacitors may be variously changed.

The interlayer insulating layer 160 has a first contact hole 66, and the first contact hole 66 may be filled with a pixel connecting member 175. A data metal layer including the data line 171, the driving voltage line 172, and the pixel connecting member 175 is disposed on the interlayer insulating layer 160. The data metal layer may be formed a single layer made of a metal layer including one of copper, a copper alloy, aluminum, an aluminum alloy, molybdenum, a molybdenum alloy, titanium, and a titanium alloy, or multiple layers including the metal layer. For example, a titanium/aluminum/titanium triple layer, or a molybdenum/aluminum/molybdenum or molybdenum/copper/molybdenum triple layer, may be applied.

The data line 171 transmits a data signal, and the data line 171 may be connected to a source electrode of the switching transistor. The driving voltage line 172 transmits a driving voltage ELVDD and may be parallel to the data line 171.

A passivation layer 181 is disposed on the data metal layer including the data line 171, the driving voltage line 172, and the pixel connecting member 175. The passivation layer 181 covers the data metal layer. In the present exemplary embodiment, the passivation layer 181 overlaps the wiring layers 170 including the data line 171 and the driving voltage line 172. The upper surface of a part of the passivation layer 181 overlapping the data line 171 has a curved portion by a step of the data line 171, and the upper surface of a part of the passivation layer 181 overlapping the driving voltage line 172 has the curved portion by the step of the driving voltage line 172. The step of a voltage line may correspond to a thickness of the voltage line in the vertical direction of FIG. 5. The curved portion of the passivation layer 181 forms a projection HP in the OLED that is described below.

The passivation layer 181 according to the present exemplary embodiment has a thickness of about 15,000 angstroms or less. If the passivation layer 181 is very thick, the above-described curved portion of the upper surface of the passivation layer 181 may disappear through planarization, thereby the following projection HP may not be formed.

The passivation layer 181 may be formed of an organic material such as a polyacryl-based resin, a polyimide-based resin, or a stacked structure of an organic material and an inorganic material.

The OLED and the pixel definition layer 350 are disposed on the passivation layer 181. The OLED includes a pixel electrode 191, a light-emitting diode display layer 360, and a common electrode 270. The pixel electrode 191 may be a reflecting electrode, and the common electrode 270 may be a transflective electrode.

In the present invention, the reflecting electrode may be an electrode including a material having a characteristic of reflecting light emitted from the light-emitting diode display layer 360 to the common electrode 270. The reflection characteristic may mean that reflectivity of incident light is about 70% or more to about 100% or less, or about 80% or more to about 100% or less.

The pixel electrode 191 may include silver (Ag), aluminum (Al), chromium (Cr), molybdenum (Mo), tungsten (W), titanium (Ti), gold (Au), palladium (Pd), or alloys thereof to be used as the reflection layer while having the function of an anode, and may be a triple layer structure of silver (Ag)/indium tin oxide (ITO)/silver (Ag) or indium tin oxide (ITO)/silver (Ag)/indium tin oxide (ITO).

In the present invention, the transflective electrode may be an electrode including a material having a transflective characteristic for transmitting part of the light incident to the common electrode 270 and reflecting a remaining part of the light to the pixel electrode 191. Here, the transflective characteristic may mean that the reflectivity of the incident light is about 0.1% or more to about 70% or less, or about 30% or more to about 50% or less.

The common electrode 270 may include silver (Ag), magnesium (Mg), aluminum (Al), chromium (Cr), molybdenum (Mo), tungsten (W), titanium (Ti), gold (Au), palladium (Pd), ytterbium (Yb), or alloys thereof.

The pixel electrode 191 may be connected to the pixel connecting member 175 through a second contact hole 86 formed in the passivation layer 181. The pixel electrode 191 receives an electrical signal from the light emission control drain electrode 157 connected to the pixel connecting member 175 to transmit an electron or a hole to the light-emitting diode display layer 360. The electron or the hole is combined with a hole or an electron supplied from the common electrode 270 in the emission layer of the light-emitting diode display layer 360, thereby forming an exciton. Light may be emitted while the exciton is stabilized.

The pixel definition layer 350 disposed on the passivation layer 181 has an opening 352 corresponding to the light emission portion of the pixel. The pixel electrode 191 may correspond to the opening 352 of the pixel definition layer 350. However, the pixel electrode 191 is not always disposed only in the opening 352 of the pixel definition layer 350. For example, as shown in FIG. 5, part of the pixel electrode 191 may be disposed under the pixel definition layer 350 so that the pixel definition layer 350 overlaps the pixel definition layer 350.

The light-emitting diode display layer 360 may be disposed on the pixel electrode 191 disposed in the opening 352 of the pixel definition layer 350. In this case, the light-emitting diode display layer 360 may include an emission layer for generating the exciton, a hole injection layer between the emission layer and the pixel electrode 191, a hole transport layer, an electron injection layer between the emission layer and the common electrode 270, and an electron transport layer.

The emission layer may be at least one of a red organic emission layer for emitting red, a blue organic emission layer for emitting blue, and a green organic emission layer for emitting green. In this case, the red organic emission layer, the blue organic emission layer, and the green organic emission layer are respectively formed in the red pixel, the green pixel, and the blue pixel, thereby realizing a color image. As a variation of the present exemplary embodiment, the emission layer may be combined with a plurality of layers representing different colors to emit white, and the plurality of layers may include a structure in which two layers or three layers are deposited. In this case, color may be realized by forming a red color filter, a green color filter, and a blue color filter for each pixel.

The OLED display according to the present exemplary embodiment, may include an encapsulation layer disposed on the common electrode 270.

In the present exemplary embodiment, the OLED has the projection HP in the light emission portion corresponding to the opening 352. The projection HP overlaps the wiring layer 170 disposed under the passivation layer 181, and the wiring layer 170 includes the data line 171 and the driving voltage line 172 separated from each other. As shown in FIG. 5, two projections HP are formed in the light emission portion corresponding to the opening 352, one over line 171 and one over line 172. Two projections HP may be symmetric with respect to each other in the light emission portion. Since the projection HP in the front display unit on the flat portion of the substrate 10 is symmetrically disposed in the light emission portion, a color shift phenomenon that may be generated in a front portion of a display may be reduced.

The structure including the OLED shown in FIG. 5 shows the part of one pixel among the plurality of pixels of FIG. 4. It is to be understood, however, that this structure may be applied to all of the pixels disposed in the front display unit 21 of FIG. 4. However, since the green pixel G is smaller than the red pixel R and the blue pixel B, the width of the opening 352 shown in FIG. 5 may be changed depending on the pixel size used.

Figure 6:
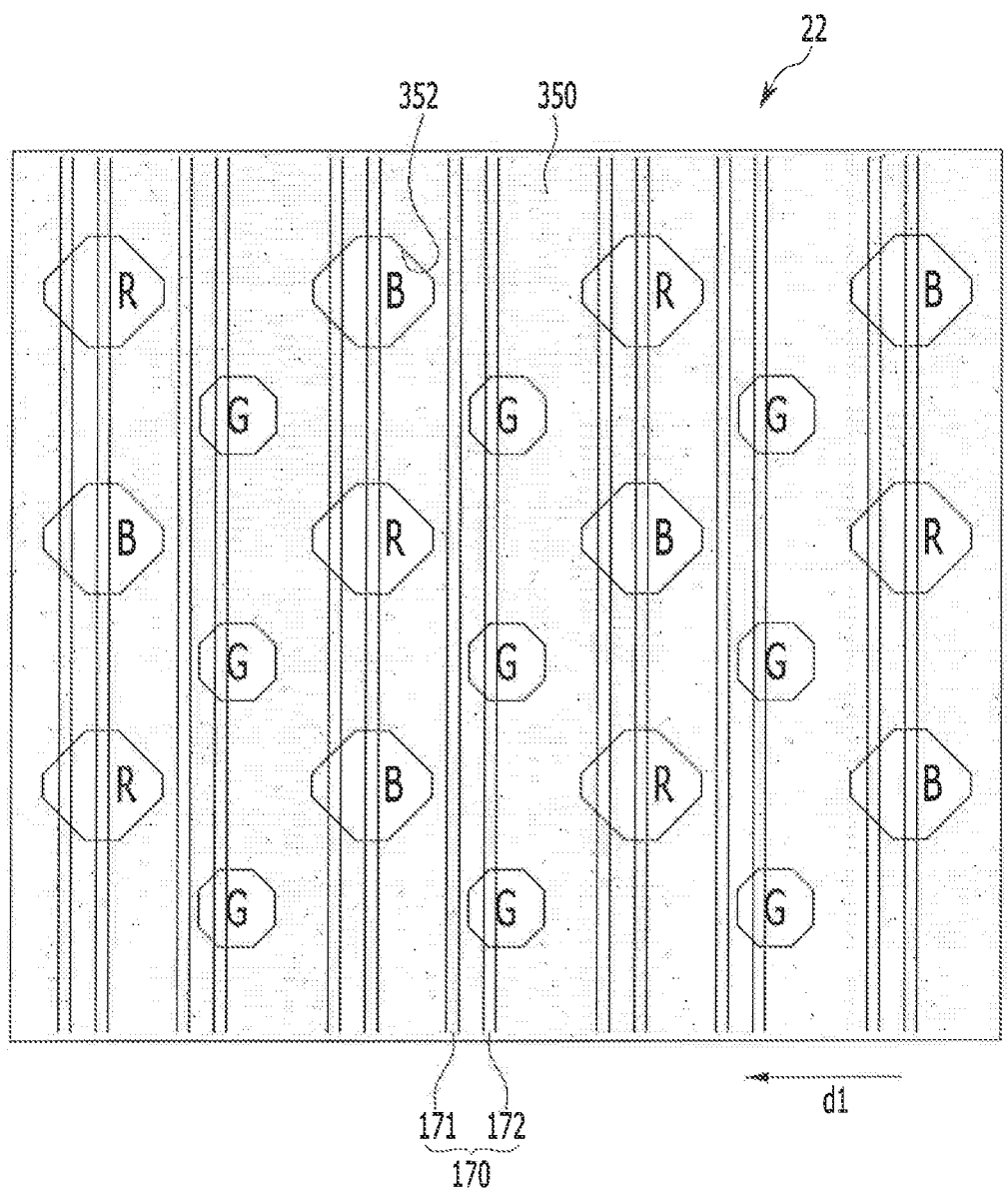
FIG. 6 is a layout view schematically showing a plurality of pixels and a wiring layer in a left bending display unit of an OLED display according to an exemplary embodiment of the present invention.
Figure 7:
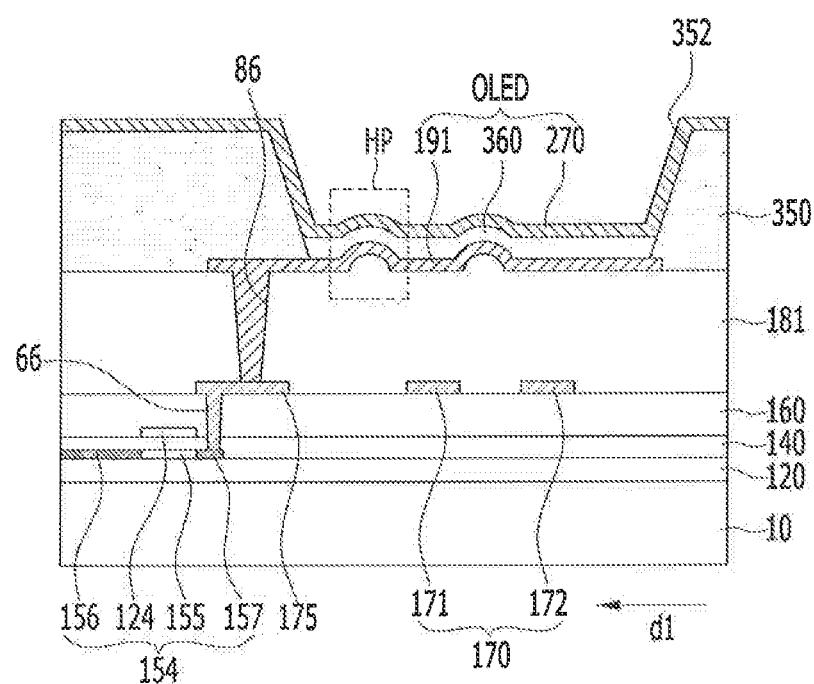
FIG. 7 is a cross-sectional view of a part of one pixel among a plurality of pixels shown in FIG. 6 according to an exemplary embodiment of the present invention.

FIG. 6 is a layout view schematically showing a plurality of pixels and a wiring layer in a left bending display unit of an OLED display according to an exemplary embodiment of the present invention. FIG. 7 is a cross-sectional view of a part of one pixel among a plurality of pixels shown in FIG. 6 according to an exemplary embodiment of the present invention.

Referring to FIG. 6, in the left bending display unit 22, the first light emission portion, the second light emission portion, and the third light emission portion respectively corresponding to the red pixel R, the green pixel G, and the blue pixel B are disposed in the opening 352 of the pixel definition layer 350. In the left bending display unit 22 disposed on the curved portion 21 of the substrate 10, the plurality of wiring layers 170 passing through the light emission portion are formed, and the wiring layers 170 may include the data line 171 and the driving voltage line 172. In the left bending display unit 22, the wiring layers 170 overlap the first light emission portion, the second light emission portion, and the third light emission portion, and the wiring layers 170 may be disposed to be asymmetric in each light emission portion. In other words, the region occupied with the wiring layer 170 in the opening 352 may have the asymmetric shape. Particularly, as shown in FIG. 2, when the direction toward the left curved portion 12 in the flat portion 11 is a first direction d1, the wiring layers 170 in FIG. 6 are located to be biased in the first direction d1 in each light emission portion.

Referring to FIG. 7, the upper surface of the passivation layer 181 overlapping the wiring layer 170 has the curved portion, and the curved portion of the passivation layer 181 forms the projection HP in the OLED. The projection HP is asymmetrically disposed to be biased in the first direction d1 in the light emission portion corresponding to the opening 352. Thus, since the projection HP generated in the bending display unit is asymmetrically disposed to be biased in the first direction d1, the angle of the light emitted from the side from the curved portion is reduced such that the WAD characteristic may be improved.

As above-described, in addition to the asymmetric arrangement structure of the wiring layers 170 and the projection HP, the configurations disposed in the left bending display unit 22 are the same as or substantially the same as the configurations of the front display unit 21 described in FIG. 5 and FIG. 6. Therefore, content described in reference to FIG. 5 and FIG. 6 may be applied to the left bending display unit 22.

The structure including the OLED shown in FIG. 7 shows the part of one pixel among the plurality of pixels of FIG. 6. It is to be understood, however, that the structure shown in FIG. 7 may be applied to all of the pixels disposed in the left bending display unit 22 of FIG. 6. However, since the green pixel G is smaller than the red pixel R and the blue pixel B, the width of the opening 352 shown in FIG. 7 may be changed depending on the size of a pixel. In addition, as shown in FIG. 6, in the case of the green pixel G, only the driving voltage line 172 among the wiring layers 170 may overlap the light emission portion corresponding to the opening 352.

Figure 8:
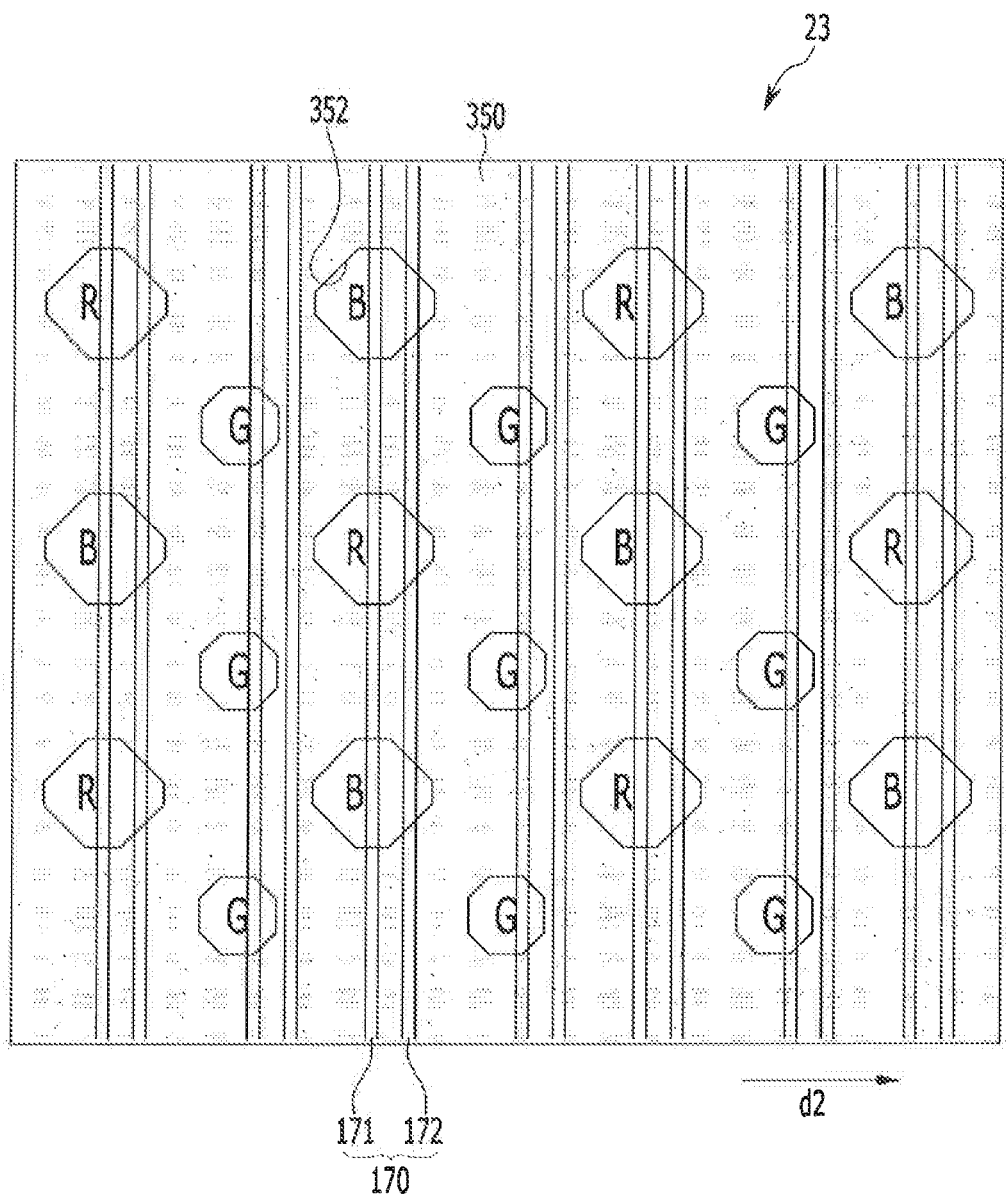
FIG. 8 is a layout view schematically showing a plurality of pixels and a wiring layer in a right bending display unit of an OLED display according to an exemplary embodiment of the present invention.
Figure 9:
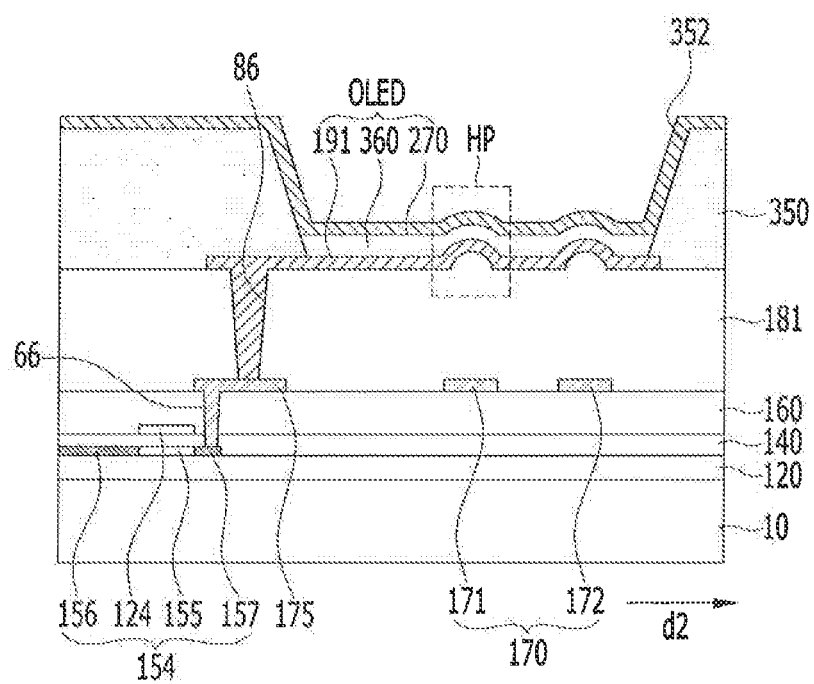
FIG. 9 is a cross-sectional view of a part of one pixel among a plurality of pixels shown in FIG. 8 according to an exemplary embodiment of the present invention.

FIG. 8 is a layout view schematically showing a plurality of pixels and a wiring layer in a right bending display unit of an OLED display according to an exemplary embodiment of the present invention. FIG. 9 is a cross-sectional view of a part of one pixel among a plurality of pixels shown in FIG. 8 according to an exemplary embodiment of the present invention.

The exemplary embodiment to be described in reference to FIG. 8 and FIG. 9 is almost the same as the exemplary embodiment described in reference to FIG. 6 and FIG. 7. However, as shown in FIG. 8 and FIG. 9, the wiring layer 170 and the projection HP are disposed to be biased in a second direction d2 opposite to the first direction d1. The second direction d2 is substantially opposite to the first direction d1. For example, as shown in FIG. 2, the second direction d2 is a direction toward the right curved portion 12 in the flat portion 11. In addition, since the projection HP generated in the right bending display unit 23 according to the present exemplary embodiment is disposed to be asymmetrically biased to the second direction d2, the angle of the light emitted from the side from the curved portion is reduced, thereby improving the WAD characteristic.

In addition to the above-described differences, the contents described in reference to FIG. 6 and FIG. 7 may be applied to the present exemplary embodiment.

In the exemplary embodiments described in FIG. 6 to FIG. 9, since the OLED having the asymmetric projection is formed in the red pixel, the green pixel, and the blue pixel, there is provided a structure that compensated for a phenomenon in which the white becomes reddish, greenish, or bluish due to a red color shift, a green color shift, and a blue color shift. In this case, the thickness of the projection in each pixel may be controlled to reduce the color shift phenomenon depending on the side viewing angle for the color emitted from the OLED.

Figure 10:
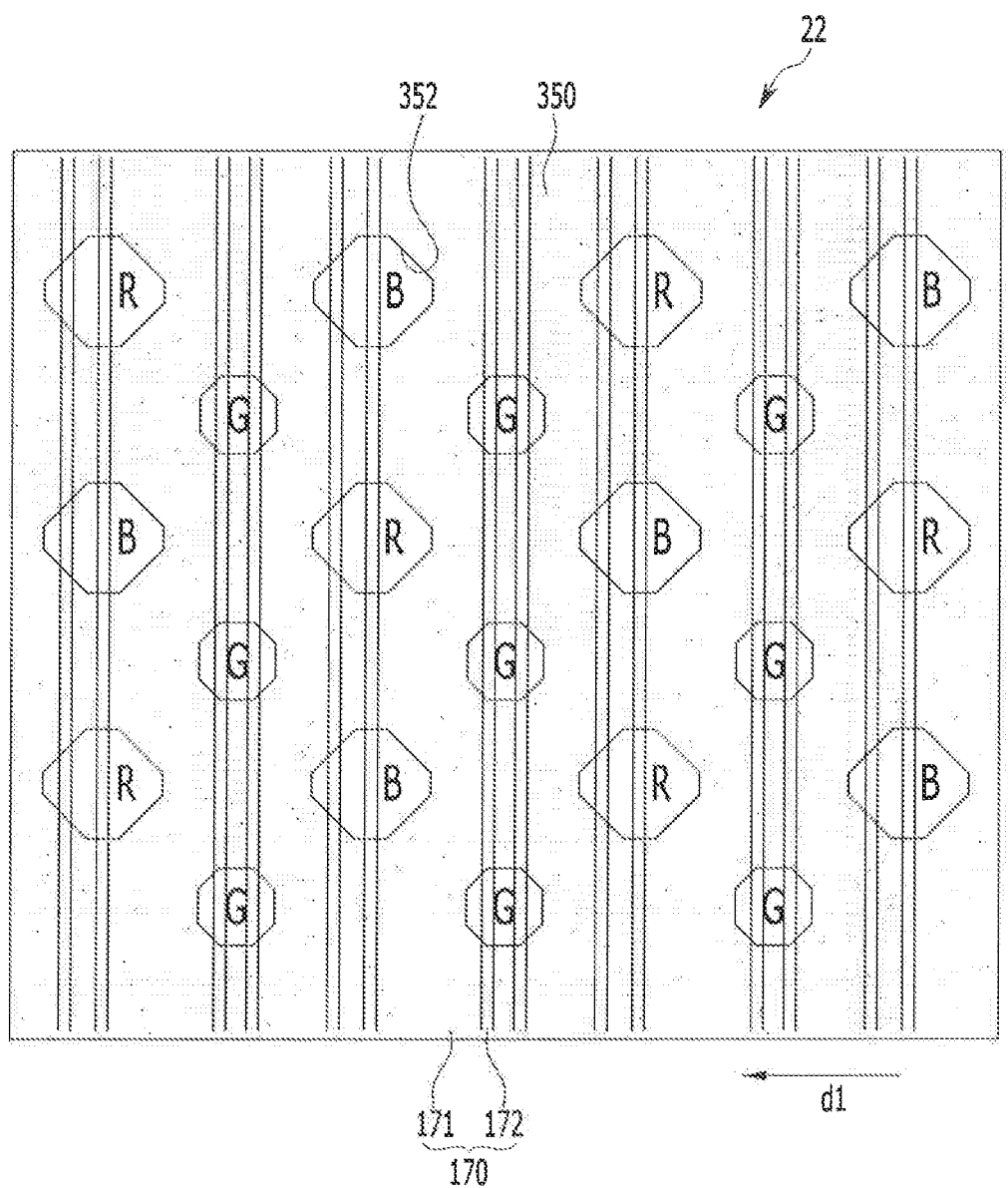
FIG. 10 is a layout view schematically showing a plurality of pixels and a wiring layer in a left bending display unit of an OLED display according to an exemplary embodiment of the present invention.
Figure 11:
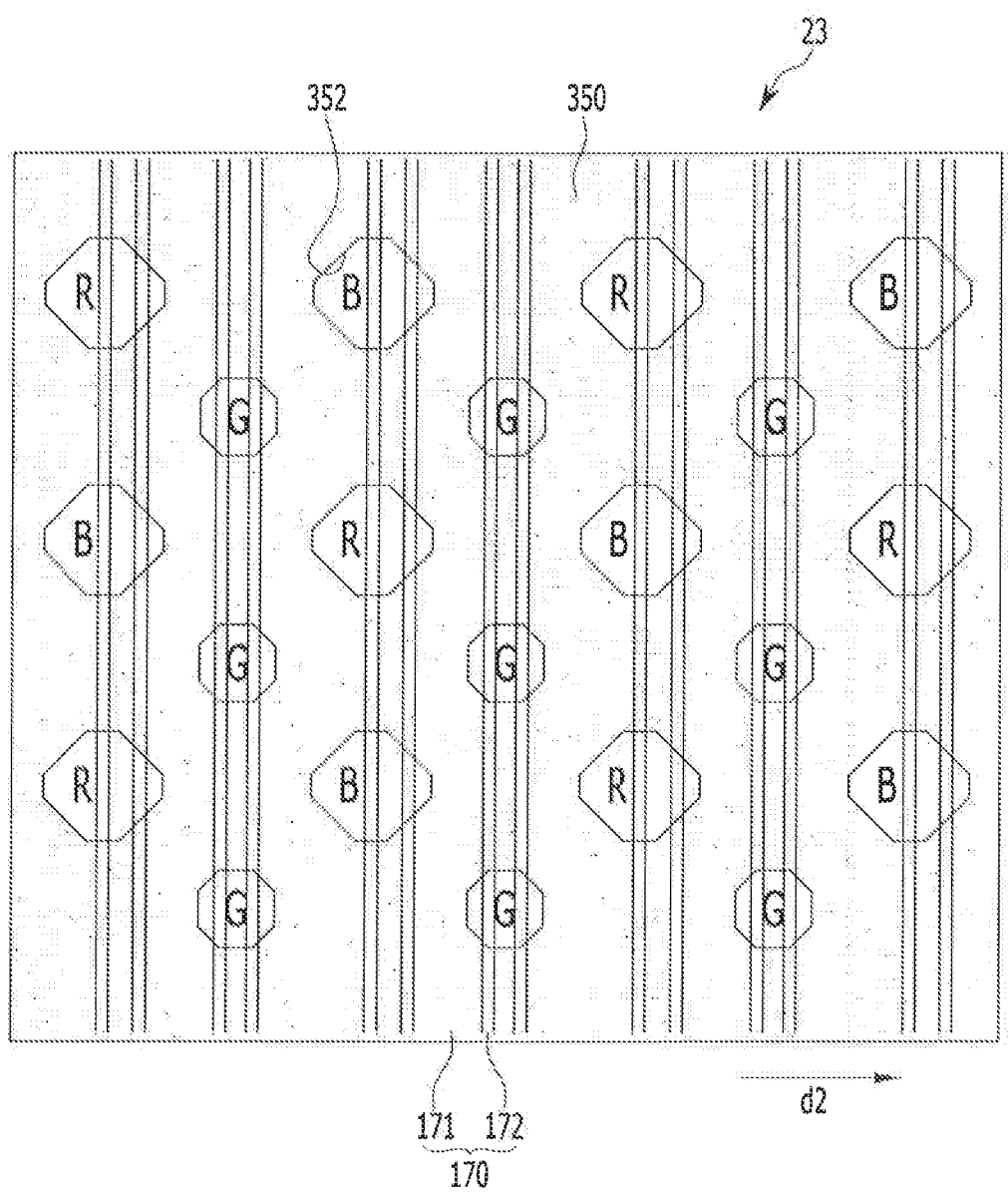
FIG. 11 is a layout view schematically showing a plurality of pixels and a wiring layer in a right bending display unit of an OLED display according to an exemplary embodiment of the present invention.

FIG. 10 is a layout view schematically showing a plurality of pixels and a wiring layer in a left bending display unit of an OLED display according to an exemplary embodiment of the present invention. FIG. 11 is a layout view schematically showing a plurality of pixels and a wiring layer in a right bending display unit of an OLED display according to an exemplary embodiment of the present invention.

Referring to FIG. 10, in the left bending display unit 22, the first light emission portion, the second light emission portion, and the third light emission portion respectively corresponding to the red pixel R, the green pixel G, and the blue pixel B are disposed in the opening 352 of the pixel definition layer 350. In the left bending display unit 22 disposed on the curved portion 12 of the substrate 10, the plurality of wiring layers 170 passing through the light emission portion are formed, and the wiring layer 170 may include the data line 171 and the driving voltage line 172. In the left bending display unit 22, the wiring layers 170 overlap the first light emission portion, the second light emission portion, and the third light emission portion, and the wiring layers 170 are asymmetrically disposed to be biased in the first direction d1 in the first light emission portion and the third light emission portion; however, the wiring layers 170 may be symmetrically disposed in the second light emission portion. The present exemplary embodiment provides a structure that compensates for the phenomenon in that the color white becomes reddish or bluish due to the red color shift or the blue color shift.

Referring to FIG. 11, like the exemplary embodiment of FIG. 10, the wiring layer 170 is asymmetrically disposed in the first light emission portion and the third light emission portion; however, the wiring layer 170 is symmetrically disposed in the second light emission portion, thereby forming the red compensation and blue compensation structure. However, the exemplary embodiment of FIG. 11 provides the compensation structure in the right bending display unit 23, and thus, the wiring layer 170 is disposed to be biased in the second direction d2 in the first light emission portion and the third light emission portion to form the asymmetric structure.

Figure 12:
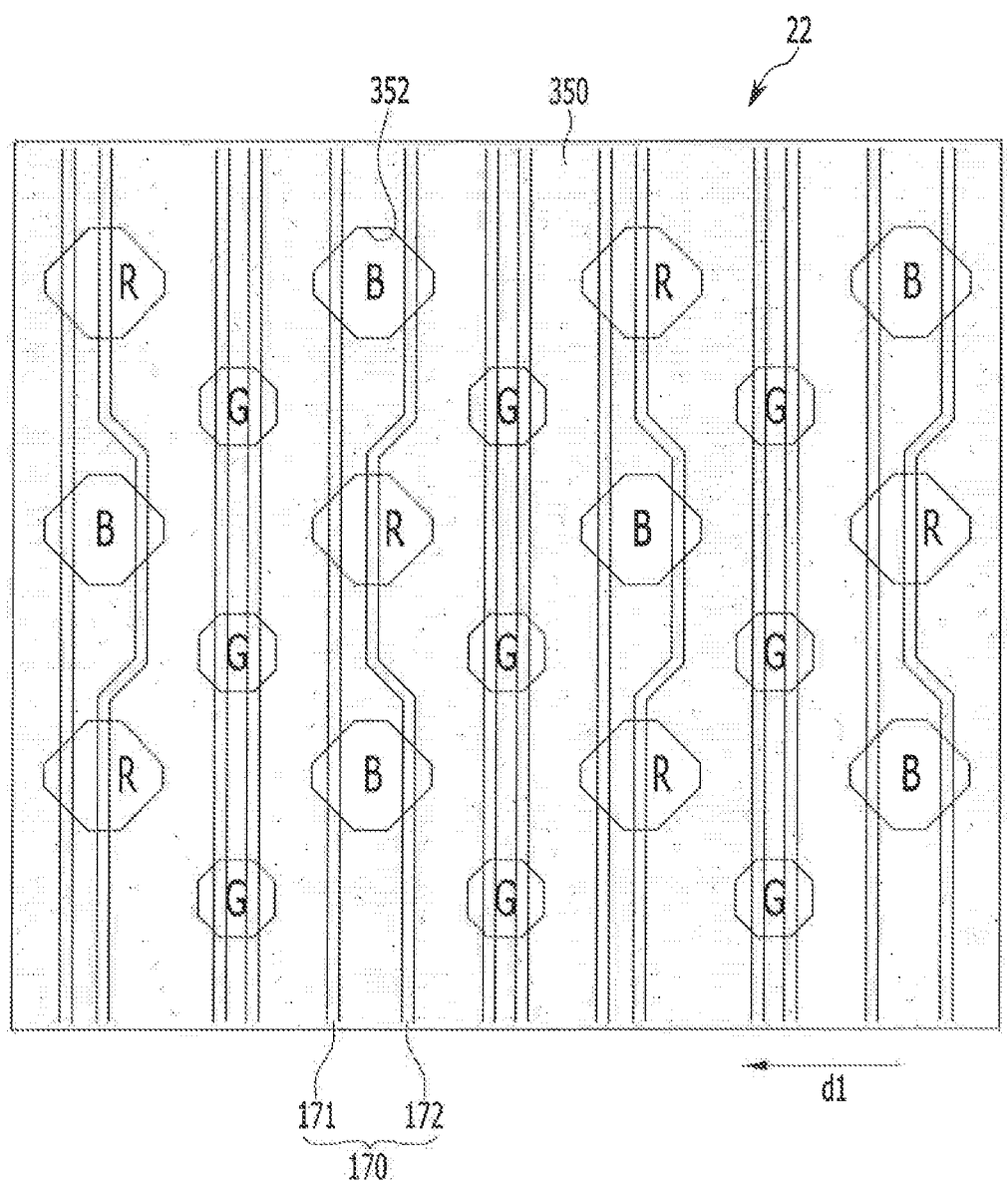
FIG. 12 is a layout view schematically showing a plurality of pixels and a wiring layer in a left bending display unit of an OLED display according to an exemplary embodiment of the present invention.
Figure 13:
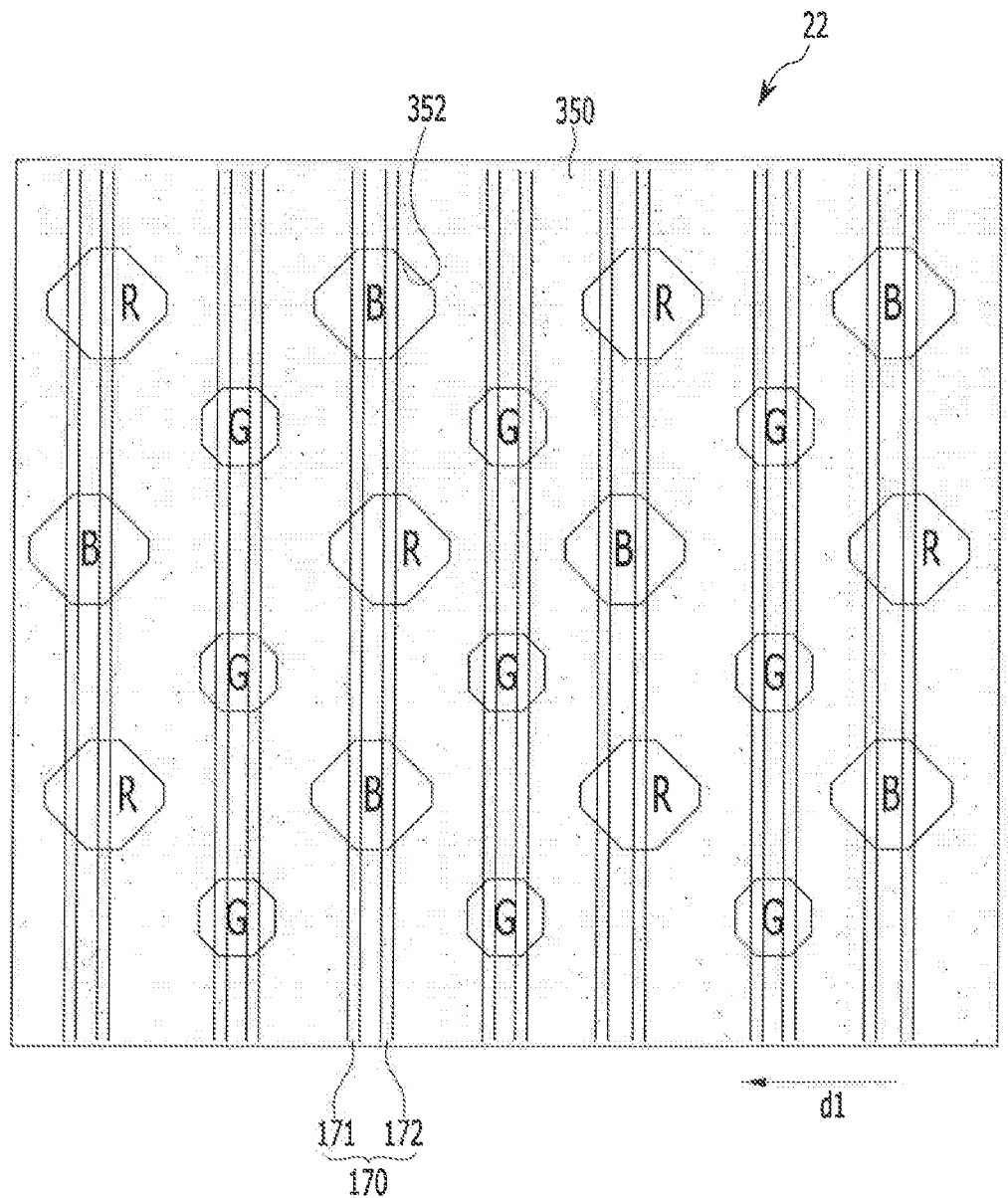
FIG. 13 is a layout view schematically showing a plurality of pixels and a wiring layer in a left bending display unit of an OLED display according to an exemplary embodiment of the present invention.

FIG. 12 is a layout view schematically showing a plurality of pixels and a wiring layer in a left bending display unit of an OLED display according to an exemplary embodiment of the present invention. FIG. 13 is a layout view schematically showing a plurality of pixels and a wiring layer in a left bending display unit of an OLED display according to an exemplary embodiment of the present invention.

Referring to FIG. 12, the wiring layer 170 is asymmetrically disposed to be biased in the first direction d1 in the first light emission portion, and the wiring layer 170 is symmetrically disposed in the second light emission portion and the third light emission portion to be the red compensation structure. To realize the red compensation structure, the interval between the data line 171 and the driving voltage line 172 in the first light emission portion and the interval between the data line 171 and the driving voltage line 172 in the third light emission portion may be different from each other. As shown in FIG. 12, the interval between the data line 171 and the driving voltage line 172 in the third light emission portion may be larger than the interval between the data line 171 and the driving voltage line 172 in the first light emission portion. Thus, as the interval of the wiring layer 170 is differentiated depending on its position, the driving voltage line 172 between the first light emission portion (R) and the third light emission portion (B) (which are adjacent to each other vertically as shown in FIG. 12) may have a bent portion.

Referring to FIG. 13, like the exemplary embodiment of FIG. 12, the wiring layer 170 is asymmetrically disposed to be biased in the first direction d1 in the first light emission portion, and the wiring layer 170 is symmetrically disposed in the second light emission portion and the third light emission portion to be the red compensation structure. However, differently from that shown in FIG. 12, the interval between the data line 171 and the driving voltage line 172 in the first light emission portion and the interval between the data line 171 and the driving voltage line 172 in the third light emission portion are equal to each other. In the present exemplary embodiment, to realize the red compensation structure, the first light emission portion (R) and the third light emission portion (B) are arranged to deviate from each other with respect to a vertical axis. In other words, as shown on FIG. 13, the first light emission portion is disposed more to the right of the vertical axis, whereas the third light emission portion is disposed more to the left of the vertical axis. Here, the vertical axis may be a direction substantially perpendicular to the first direction d1.

Figure 14:
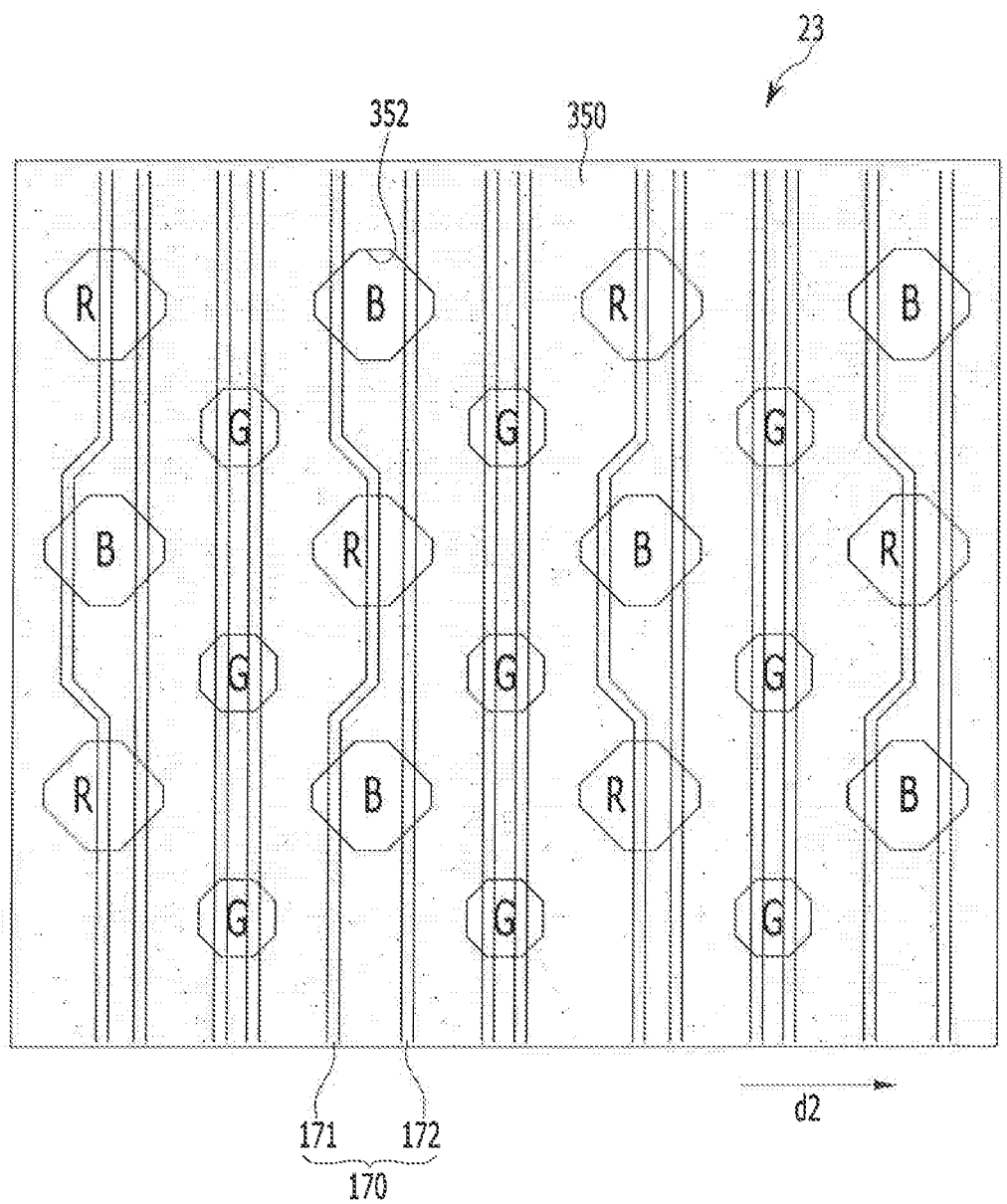
FIG. 14 is a layout view schematically showing a plurality of pixels and a wiring layer in a right bending display unit of an OLED display according to an exemplary embodiment of the present invention.
Figure 15:
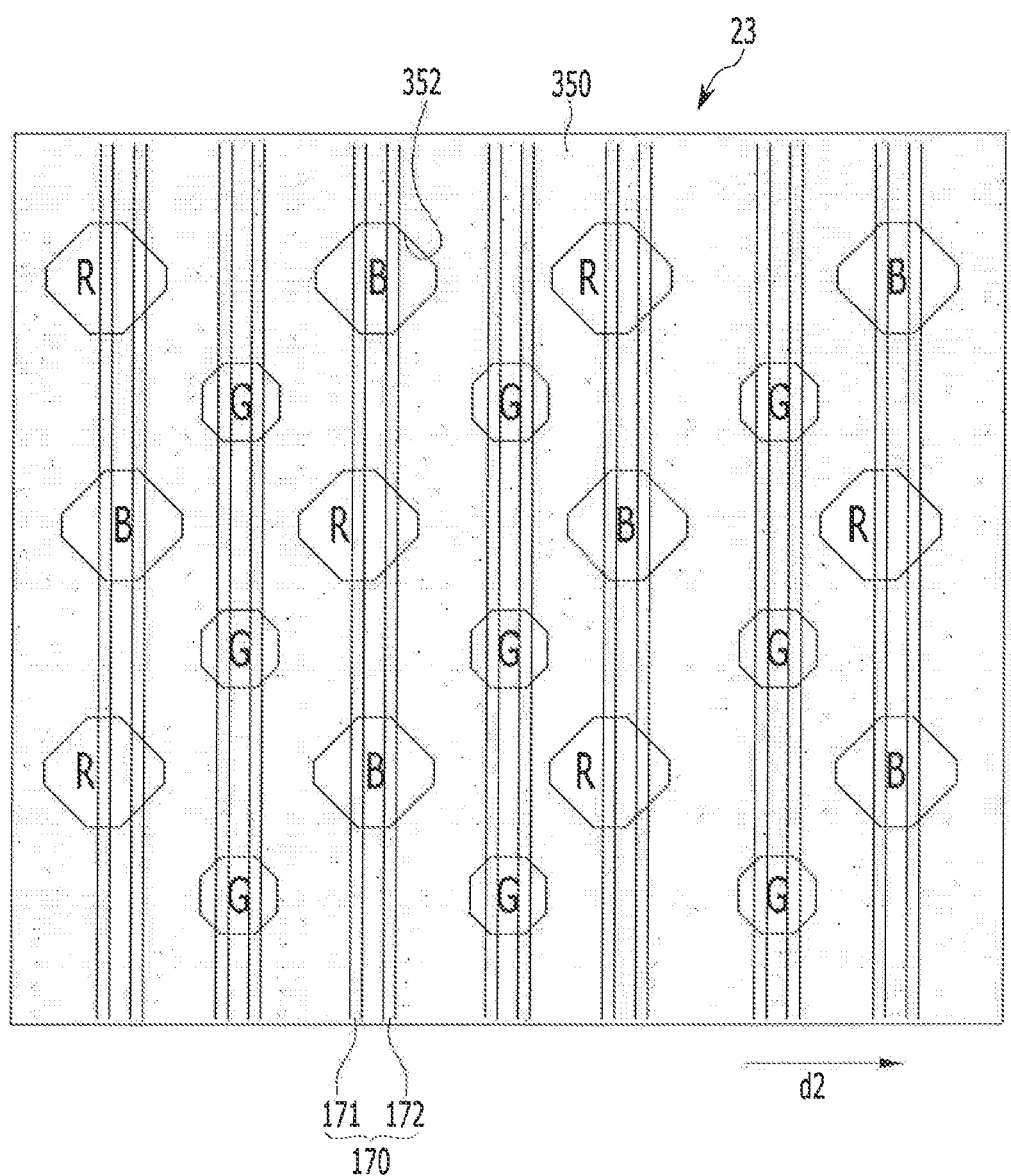
FIG. 15 is a layout view schematically showing a plurality of pixels and a wiring layer in a right bending display unit of an OLED display according to an exemplary embodiment of the present invention.

FIG. 14 is a layout view schematically showing a plurality of pixels and a wiring layer in a right bending display unit of an OLED display according to an exemplary embodiment of the present invention. FIG. 15 is a layout view schematically showing a plurality of pixels and a wiring layer in a right bending display unit of an OLED display according to an exemplary embodiment of the present invention.

Referring to FIG. 14, like the exemplary embodiment of FIG. 12, the wiring layer 170 is asymmetrically disposed in the first light emission portion, and the wiring layer 170 is symmetrically disposed in the second light emission portion and the third light emission portion to be the red compensation structure. However, the exemplary embodiment of FIG. 14 is the compensation structure of the right bending display unit 23, and the wiring layer 170 is disposed to be biased in the second direction d2 in the first light emission portion formed with the asymmetric structure. Thus, as the interval of the wiring layer 170 is differentiated depending on its position, the data line 171 between the first light emission portion (R) and the third light emission portion (B) vertically adjacent with respect to each other may have a bent portion.

Referring to FIG. 15, like the exemplary embodiment of FIG. 14, the wiring layer 170 is disposed to be asymmetrically biased in the second direction d2 in the first light emission portion, and the wiring layer 170 is symmetrically disposed in the second light emission portion and the third light emission portion to be the red compensation structure. However, differently from that shown in FIG. 14, the interval between the data line 171 and the driving voltage line 172 in the third light emission portion and the interval between the data line 171 and the driving voltage line 172 in the first light emission portion are equal to each other. In the present exemplary embodiment, to realize the red compensation structure, the first light emission portion and the third light emission portion deviate from each other with respect to a vertical axis. Here, the vertical axis may be a direction substantially perpendicular to the second direction d2.

Figure 16:
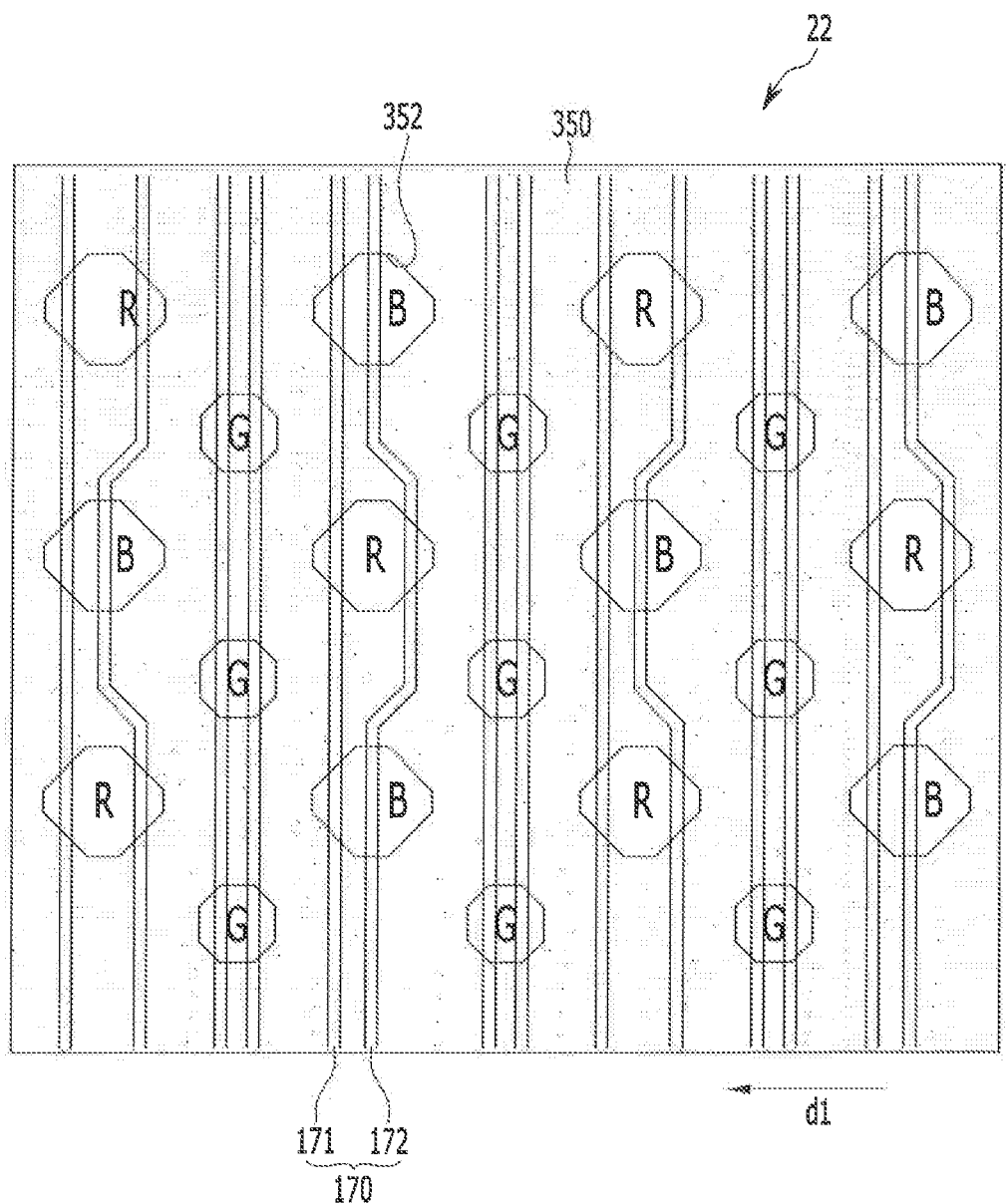
FIG. 16 is a layout view schematically showing a plurality of pixels and a wiring layer in a left bending display unit of an OLED display according to an exemplary embodiment of the present invention.
Figure 17:
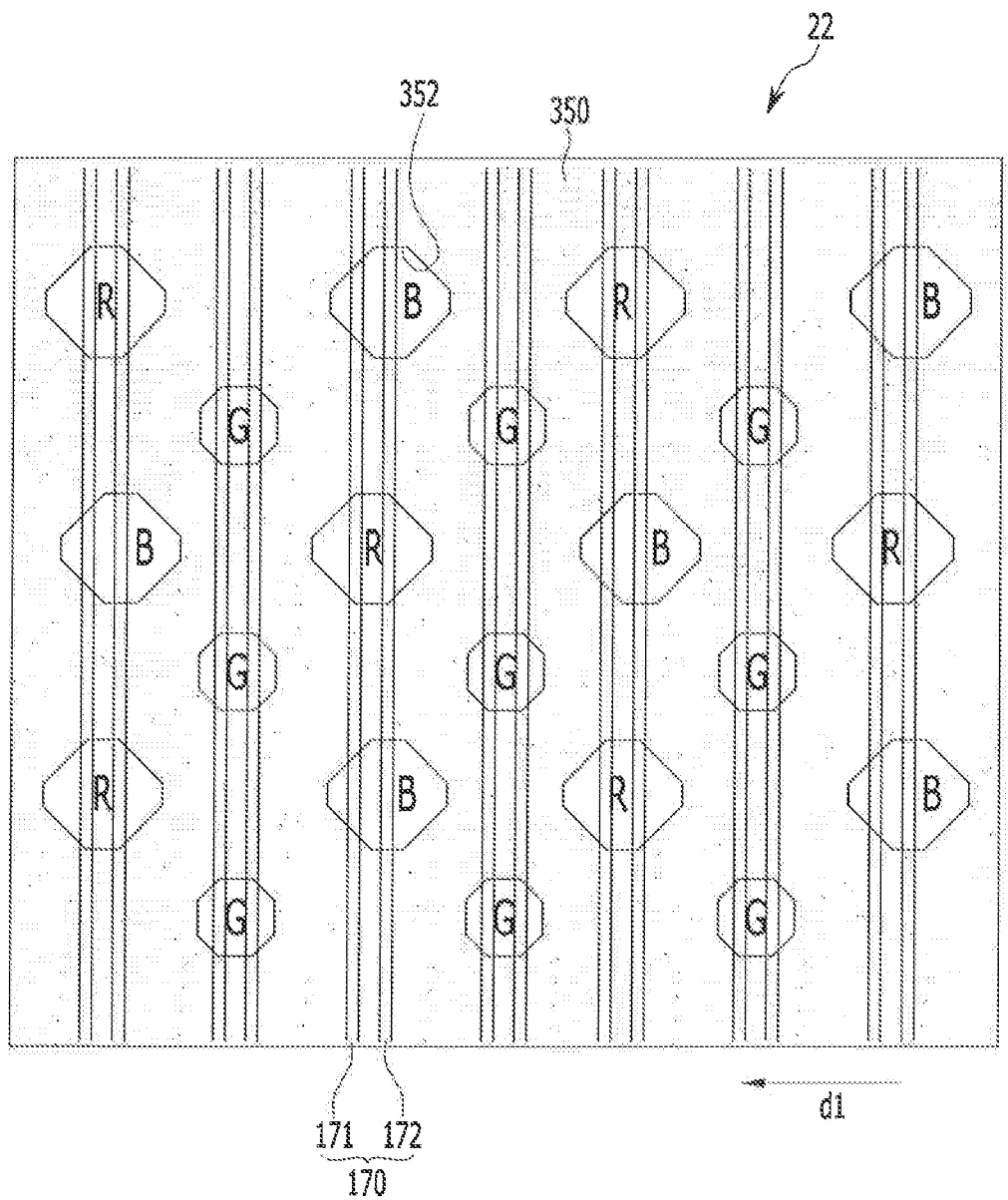
FIG. 17 is a layout view schematically showing a plurality of pixels and a wiring layer in a left bending display unit of an OLED display according to an exemplary embodiment of the present invention.

FIG. 16 is a layout view schematically showing a plurality of pixels and a wiring layer in a left bending display unit of an OLED display according to an exemplary embodiment of the present invention. FIG. 17 is a layout view schematically showing a plurality of pixels and a wiring layer in a left bending display unit of an OLED display according to an exemplary embodiment of the present invention.

Referring to FIG. 16, the wiring layer 170 is disposed to be asymmetrically biased in the first direction d1 in the third light emission portion, and the wiring layer 170 is symmetrically disposed in the first light emission portion and the second light emission portion to be the blue compensation structure. To realize the blue compensation structure, the interval between the data line 171 and the driving voltage line 172 in the first light emission portion and the interval between the data line 171 and the driving voltage line 172 in the third light emission portion may be different from each other. As shown in FIG. 16, the interval between the data line 171 and the driving voltage line 172 in the third light emission portion may be narrower than the interval between the data line 171 and the driving voltage line 172 in the first light emission portion. Thus, as the interval of the wiring layer 170 is differentiated depending on its position, the driving voltage line 172 between the first light emission portion and the third light emission portion that are vertically adjacent to each other may have a bent portion.

Referring to FIG. 17, like the exemplary embodiment of FIG. 16, the wiring layer 170 is asymmetrically disposed to be biased in the first direction d1 in the third light emission portion, and the wiring layer 170 is symmetrically disposed in the first light emission portion and the second light emission portion to be the blue compensation structure. However, differently from that shown in FIG. 16, the interval between the data line 171 and the driving voltage line 172 in the first light emission portion and the interval between the data line 171 and the driving voltage line 172 in the third light emission portion are equal to each other. In the present exemplary embodiment, to realize the blue compensation structure, the first light emission portion and the third light emission portion deviate from each other with respect to the vertical axis. Here, the vertical axis may be a direction substantially perpendicular to the first direction d1.

Figure 18:
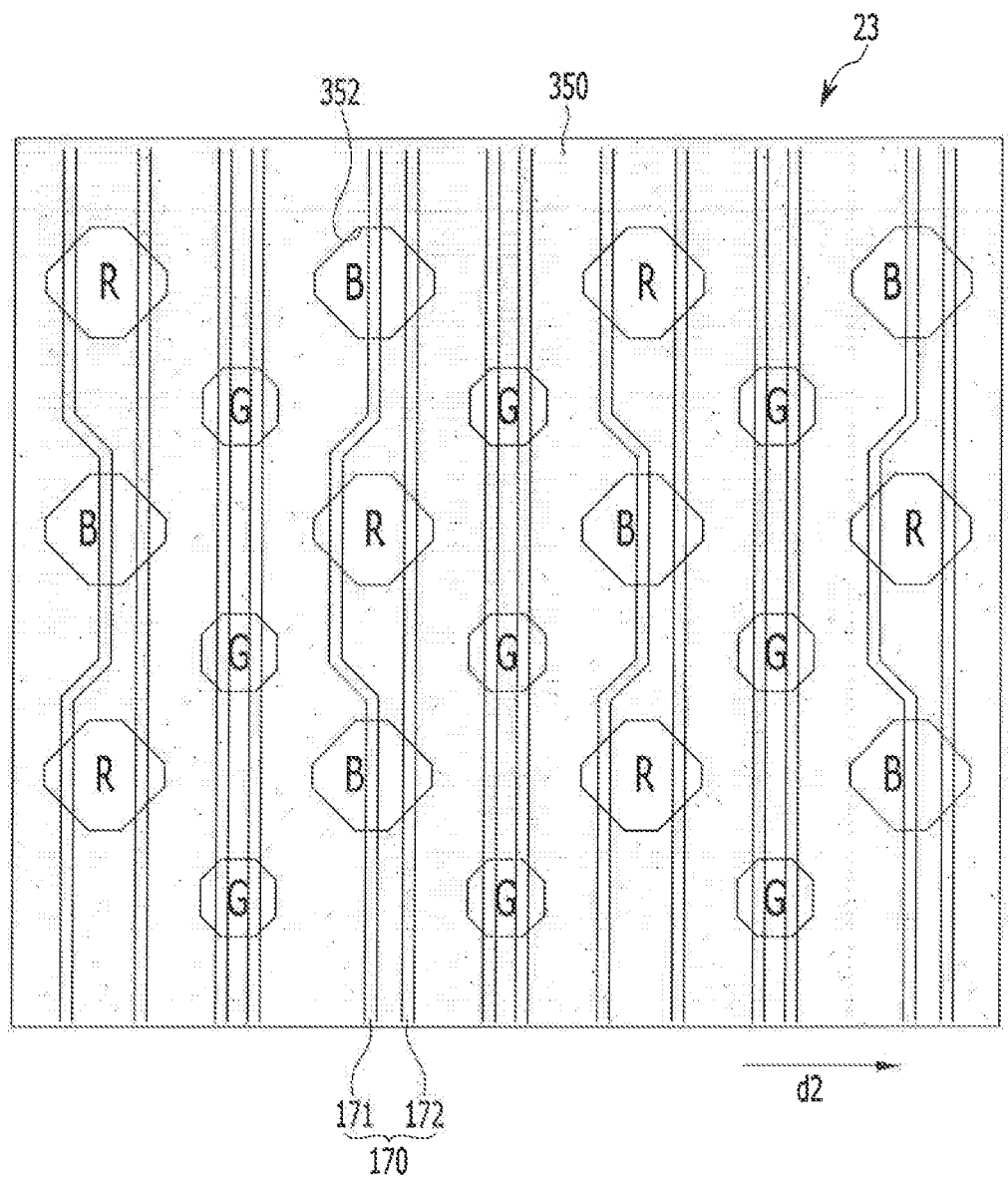
FIG. 18 is a layout view schematically showing a plurality of pixels and a wiring layer in a right bending display unit of an OLED display according to an exemplary embodiment of the present invention.
Figure 19:
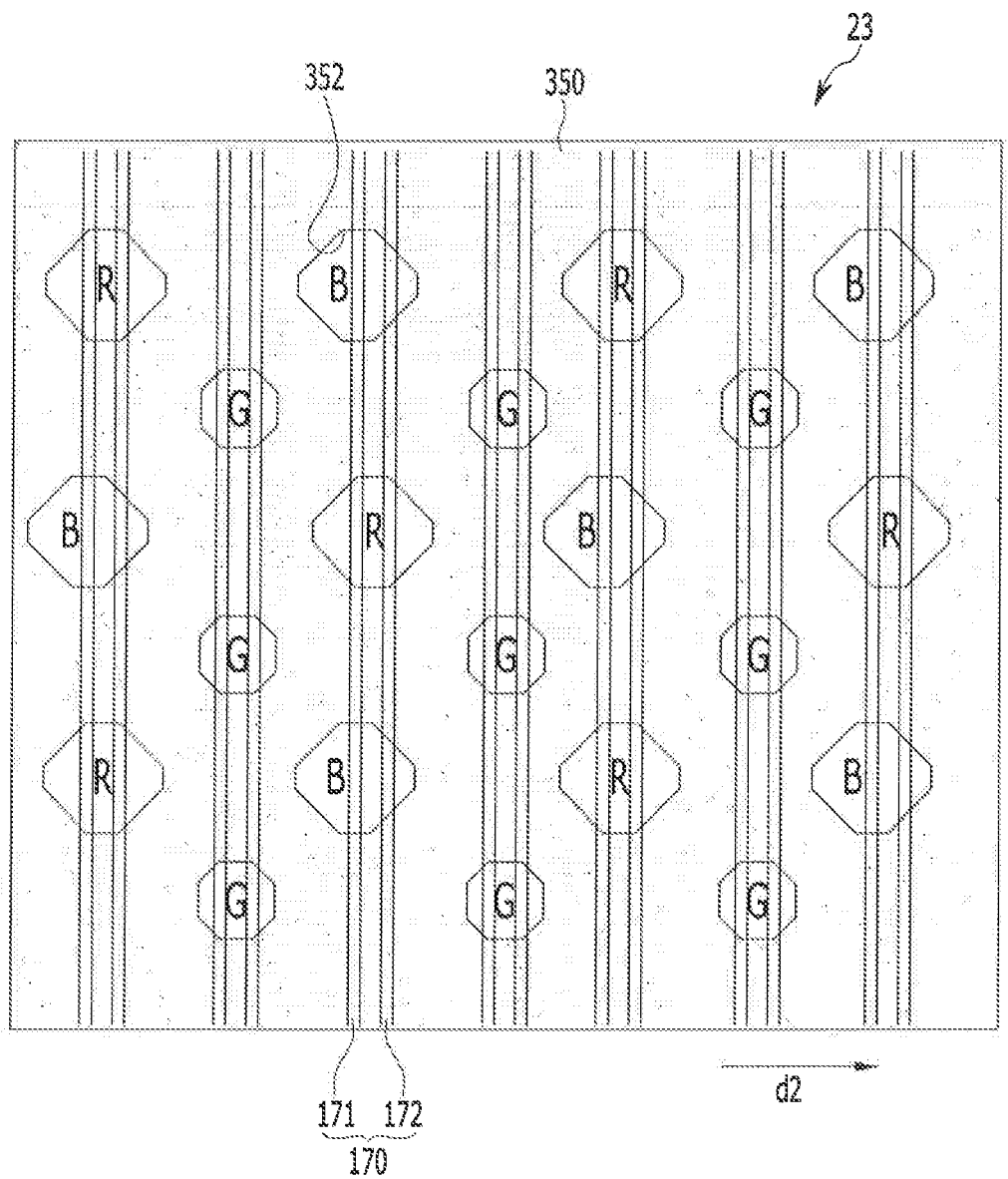
FIG. 19 is a layout view schematically showing a plurality of pixels and a wiring layer in a right bending display unit of an OLED display according to an exemplary embodiment of the present invention.

FIG. 18 is a layout view schematically showing a plurality of pixels and a wiring layer in a right bending display unit of an OLED display according to an exemplary embodiment of the present invention. FIG. 19 is a layout view schematically showing a plurality of pixels and a wiring layer in a right bending display unit of an OLED display according to an exemplary embodiment of the present invention.

Referring to FIG. 18, like the exemplary embodiment of FIG. 16, the wiring layer 170 is asymmetrically disposed in the third light emission portion, and the wiring layer 170 is symmetrically disposed in the first light emission portion and the second light emission portion to be the blue compensation structure. However, the exemplary embodiment of FIG. 18 is the compensation structure of the right bending display unit 23, and to form the compensation structure, the wiring layer 170 is disposed to be biased in the second direction d2 in the third light emission portion. Thus, as the interval of the wiring layer 170 is differentiated depending on its position, the data line 171 between the first light emission portion and the third light emission portion vertically adjacent to each other may have the bent portion.

Referring to FIG. 19, like the exemplary embodiment of FIG. 18, the wiring layer 170 is asymmetrically disposed to be biased in the second direction d2 in the third light emission portion, and the wiring layer 170 is symmetrically disposed in the first light emission portion and the second light emission portion to be the blue compensation structure. However, differently from that shown in FIG. 18, the interval between the data line 171 and the driving voltage line 172 in the first light emission portion and the interval between the data line 171 and the driving voltage line 172 in the third light emission portion are equal to each other. In the present exemplary embodiment, to realize the blue compensation structure, the first light emission portion and the third light emission portion deviate from each other with respect to the vertical axis. Here, the vertical axis may be the direction substantially perpendicular to the second direction d2.

Figure 20:
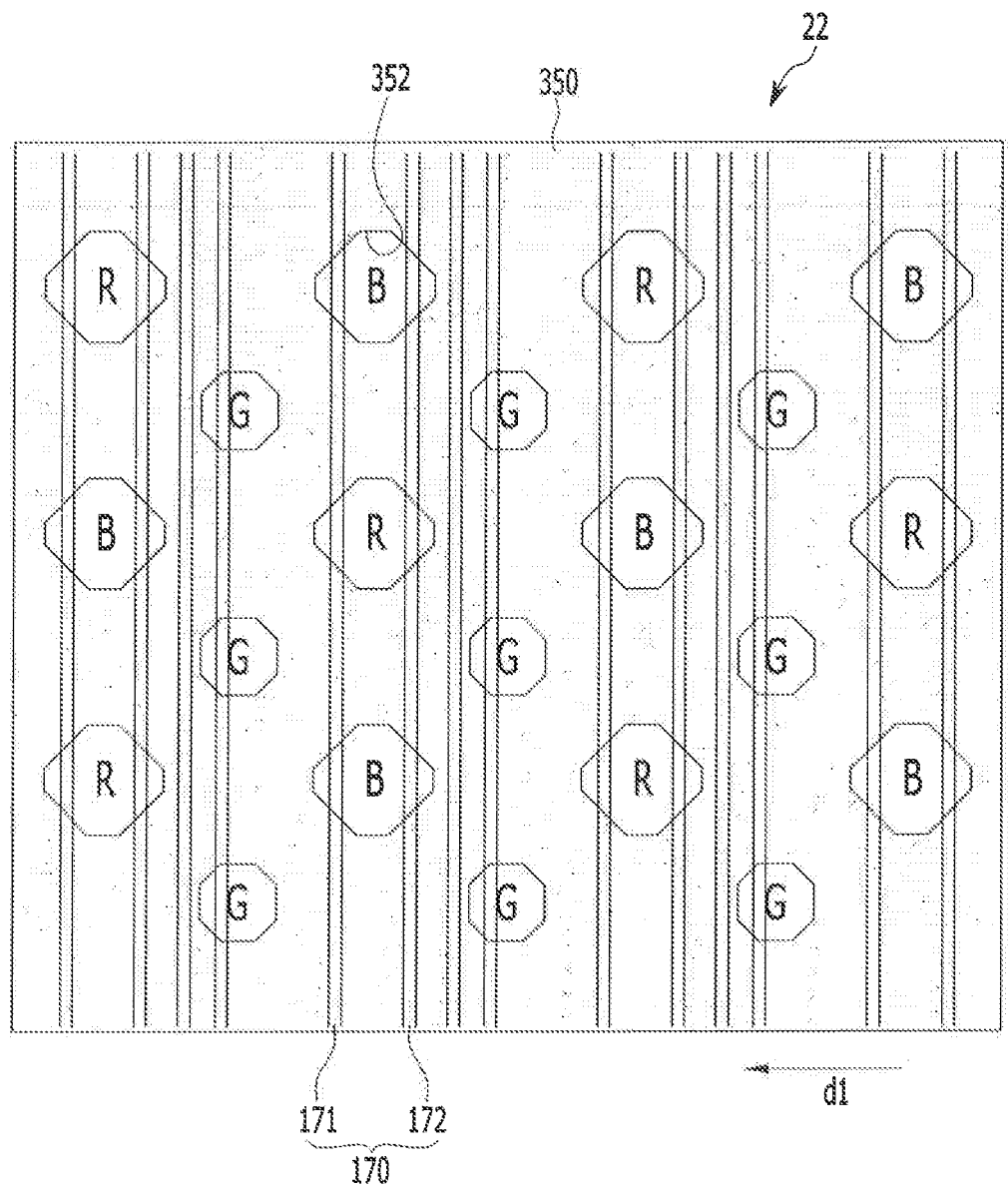
FIG. 20 is a layout view schematically showing a plurality of pixels and a wiring layer in a left bending display unit of an OLED display according to an exemplary embodiment of the present invention.
Figure 21:
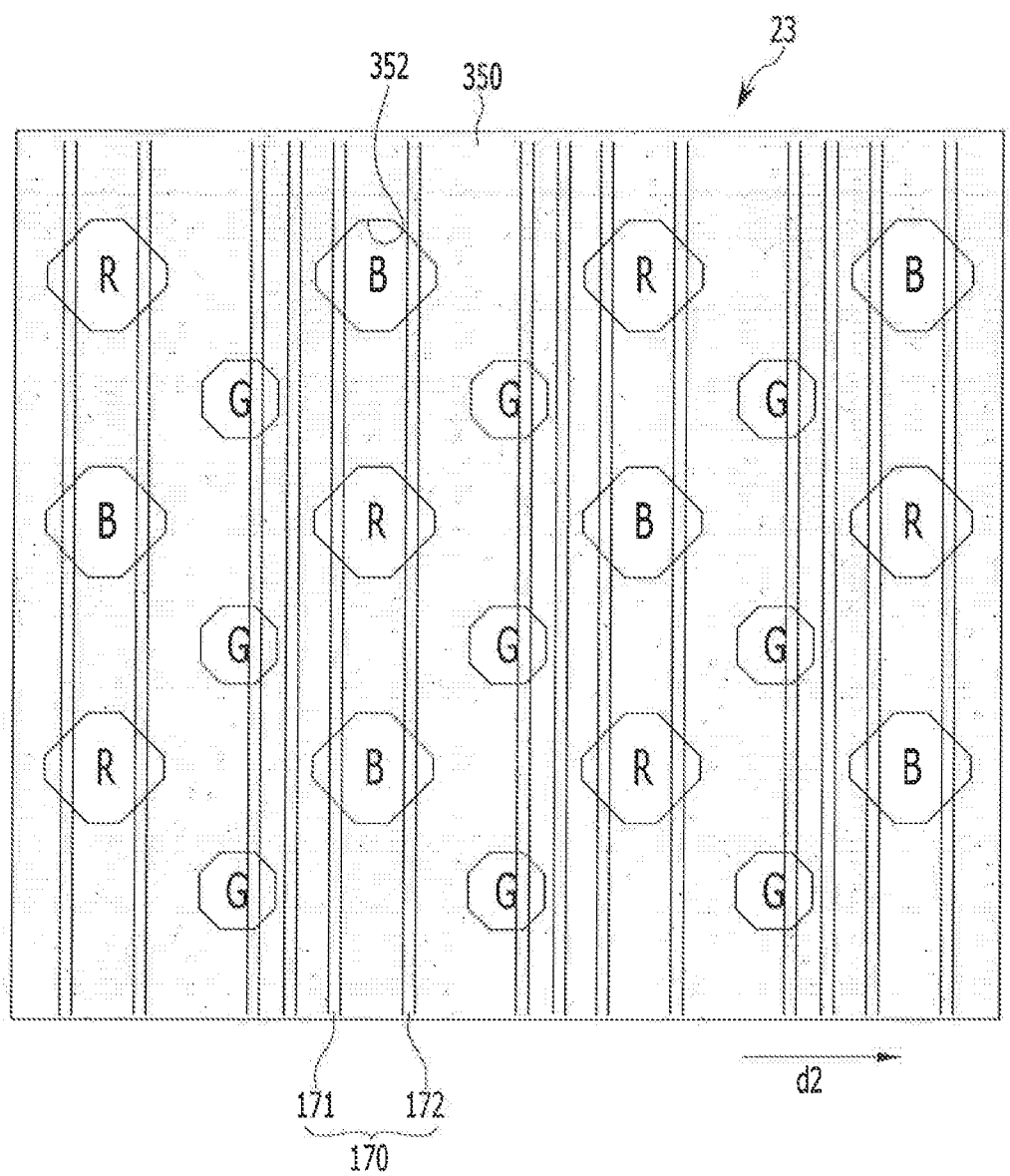
FIG. 21 is a layout view schematically showing a plurality of pixels and a wiring layer in a right bending display unit of an OLED display according to an exemplary embodiment of the present invention.

FIG. 20 is a layout view schematically showing a plurality of pixels and a wiring layer in a left bending display unit of an OLED display according to an exemplary embodiment of the present invention. FIG. 21 is a layout view schematically showing a plurality of pixels and a wiring layer in a right bending display unit of an OLED display according to an exemplary embodiment of the present invention.

Referring to FIG. 20, the wiring layer 170 is symmetrically disposed in the first light emission portion and the third light emission portion, and the wiring layer 170 is asymmetrically disposed to be biased in the first direction d1 in the second light emission portion to be the green compensation structure. To realize the green compensation structure, the driving voltage line 172 of the wiring layer 170 may only be disposed to be biased in the first direction d1 in the second light emission portion, and the data line 171 may not pass through the second light emission portion.

Referring to FIG. 21, like the exemplary embodiment of FIG. 20, the wiring layer 170 is symmetrically disposed in the first light emission portion and the third light emission portion, and the wiring layer 170 is asymmetrically disposed in the second light emission portion to be the green compensation structure. However, the exemplary embodiment of the FIG. 21 is the compensation structure of the right bending display unit 23, and to form the compensation structure, the wiring layer 170 is disposed to be biased in the second direction d2 in the second light emission portion. In addition, to realize the compensation structure, the data line 171 of the wiring layer 170 may only be disposed to be biased in the second direction d2 in the second light emission portion, and the driving voltage line 172 may not pass through the second light emission portion.

Figure 22:
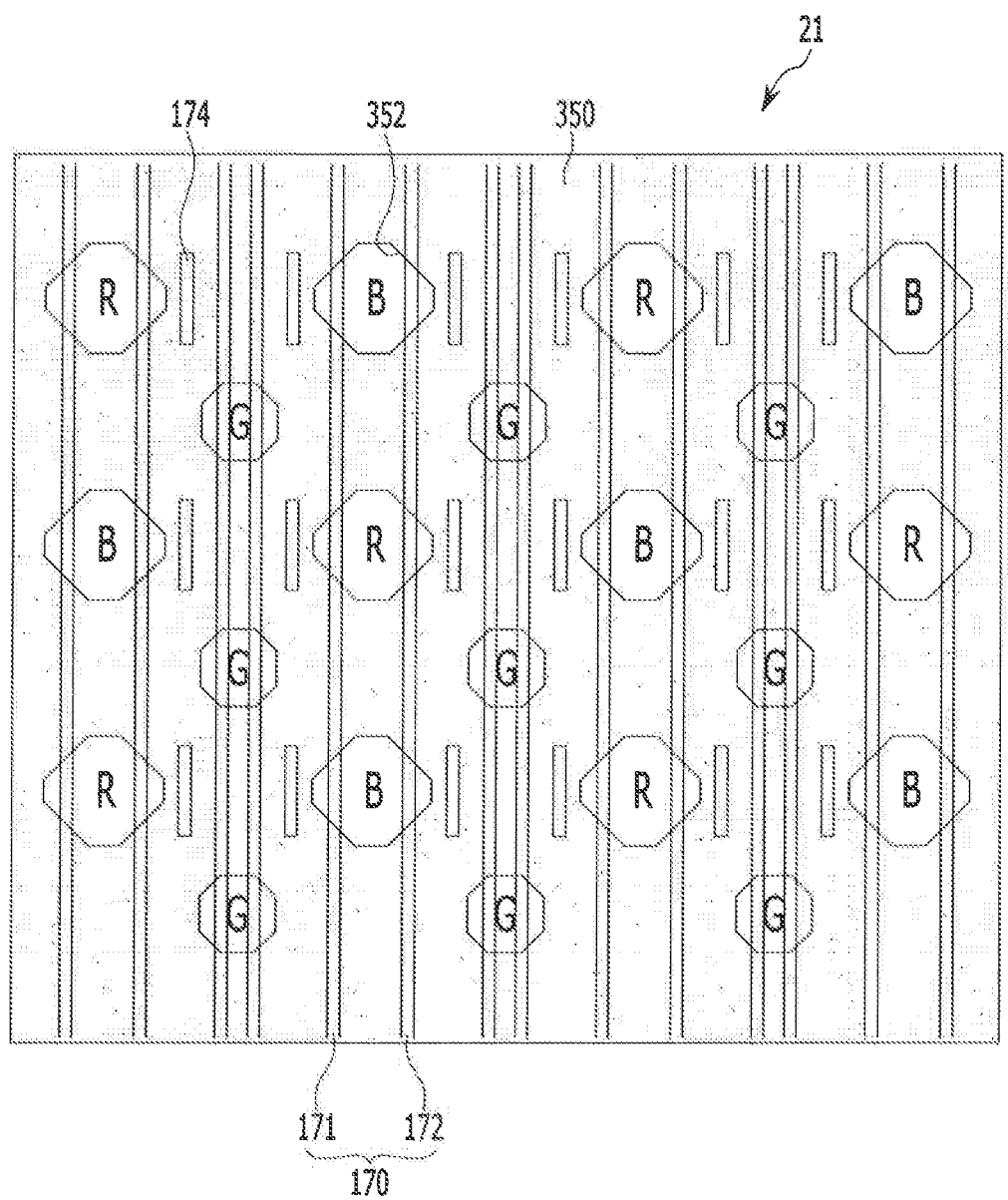
FIG. 22 is a layout view schematically showing a plurality of pixels, a wiring layer, and a driving connecting member in a front display unit of an OLED display according to an exemplary embodiment of the present invention.

FIG. 22 is a layout view schematically showing a plurality of pixels, a wiring layer, and a driving connecting member in a front display unit of an OLED display according to an exemplary embodiment of the present invention. The exemplary embodiment described in FIG. 22 is almost the same as the exemplary embodiment described in the FIG. 4 such that mainly differences will be described below.

Referring to FIG. 22, in addition to the elements of FIG. 4, a driving connecting member 174 may be disposed in the front display unit 21. The driving connecting member 174 is disposed in the same layer as the wiring layer 170 including the data line 171 and the driving voltage line 172.

Figure 23:
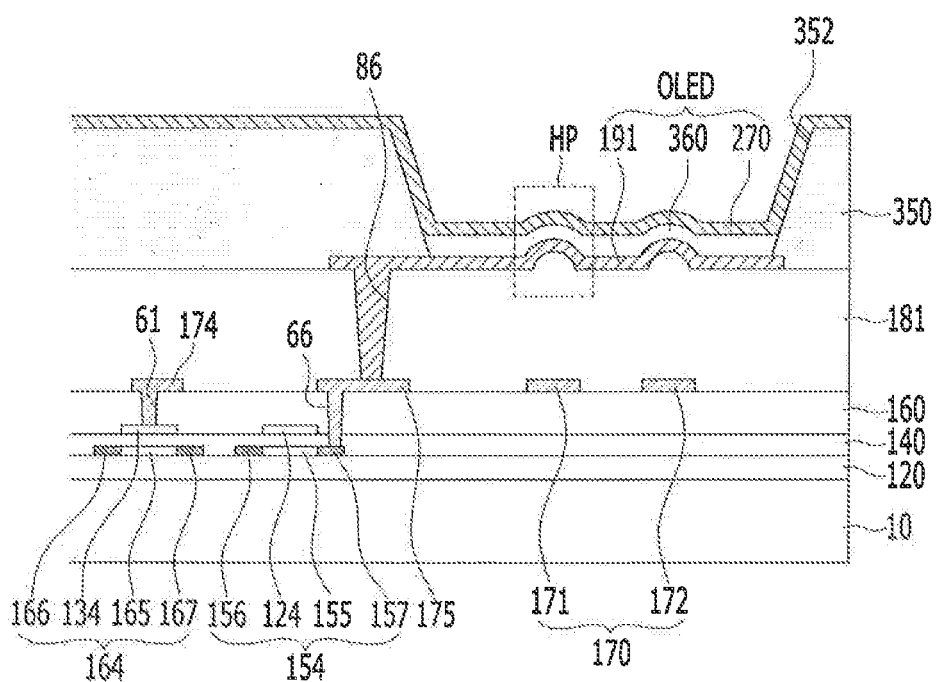
FIG. 23 is a cross-sectional view of a part of one pixel among a plurality of pixels shown in FIG. 22 according to an exemplary embodiment of the present invention.

FIG. 23 is a cross-sectional view of a part of one pixel among a plurality of pixels shown in FIG. 22 according to an exemplary embodiment of the present invention. The exemplary embodiment described in FIG. 23 is almost the same as the exemplary embodiment described in the FIG. 5 such that mainly differences will be described below.

Referring to FIG. 23, a driving transistor 164 includes a driving channel 165, a driving gate electrode 134, a driving source electrode 166, and a driving drain electrode 167. The driving gate electrode 134 overlaps the driving channel 165, and the driving source electrode 166 and the driving drain electrode 167 are formed on both sides of the driving channel 165. The driving gate electrode 134 is connected to the driving connecting member 174 through a driving contact hole 61. The driving gate electrode 134 is disposed in the same layer as the light emission control gate electrode 124, and the driving connecting member 174 is disposed in the same layer as the wiring layer 170.

Figure 24:
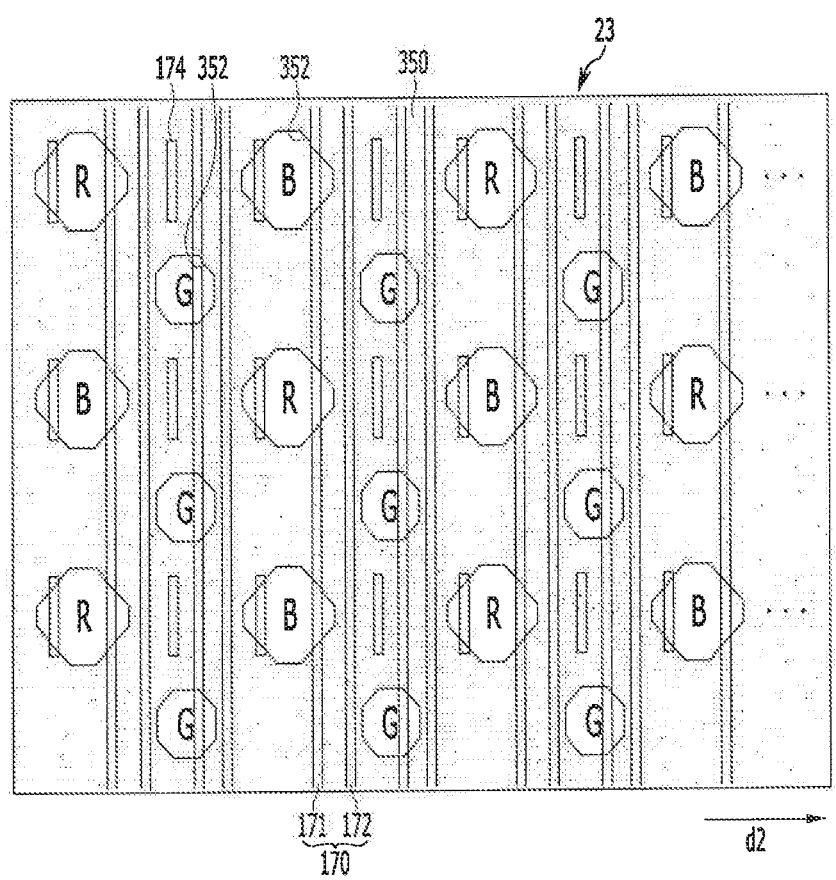
FIG. 24 is a layout view schematically showing a plurality of pixels, a wiring layer, and a driving connecting member in a right bending display unit of an OLED display according to an exemplary embodiment of the present invention.

FIG. 24 is a layout view schematically showing a plurality of pixels, a wiring layer, and a driving connecting member in a right bending display unit of an OLED display according to an exemplary embodiment of the present invention. The exemplary embodiment described in FIG. 24 is almost the same as the exemplary embodiment described in the FIG. 21 such that mainly differences will be described below.

Referring to FIG. 24, like the exemplary embodiment of FIG. 21, the symmetric structure is formed in the first light emission portion and the third light emission portion, however the asymmetric structure is formed in the second light emission portion to be the green compensation structure. To form the symmetric structure in the first light emission portion and the third light emission portion, like the exemplary embodiment of FIG. 21, the driving connecting member 174 and the data line 171 substantially form the symmetric structure in the first light emission portion and the third light emission portion of the present exemplary embodiment.

In the exemplary embodiment of FIG. 24, the green compensation structure is formed by the wiring layer 170 and the driving connecting member 174. It is to be understood, however, that such a variation may be applied to the red compensation structure and the blue compensation structure and such a variation may also be applied to the left bending display unit as well as the right bending display unit.

Next, a luminance change and a color coordinate change amount depending on the change of the viewing angle based on the front side of a display will be described in a comparative example with reference to the present invention. For example, FIGS. 25 to 32 illustrate Reference Example 1, Reference Example 2, Exemplary Embodiment 1, and Exemplary Embodiment 2. A color change amount corresponding to a Y-axis of FIG. 26 to FIG. 28, and FIG. 30 to FIG. 32, represents the color coordinate change amount.

Reference Example 1 is a case where the angle of the projection is about 3 degrees in the red pixel, the angle of the projection is about 4 degrees in the green pixel and the blue pixel, and the wiring layer forming these angles is symmetrically disposed in the light emission portion. Reference Example 2 is a case where the angle of the projection is about 10 degrees in the red pixel, the green pixel, and the blue pixel, and the wiring layer to form this angle is symmetrically disposed in the light emission portion. Exemplary Embodiment 1 is a case where the angle of the projection is about 3 degrees in the red pixel, the angle of the projection is about 4 degrees in the green pixel and the blue pixel, and the wiring layer forming these angles is asymmetrically disposed in the light emission portion of the right bending display unit. Exemplary Embodiment 2 is a case where the angle of the projection is about 10 degrees in the red pixel, the green pixel, and the blue pixel, and the wiring layer to form this angle is symmetrically disposed in the light emission portion of the right bending display unit. The luminance change and the color coordinate change amount that are measured in Exemplary Embodiments 1 and 2 represent the light emitted from the left side when viewing the user views the OLED display. Here, the angle of the projection may be a tangent value when a first side is a bottom side and a second side is a height in a right triangle made of the first side corresponding to the entire width of the projection and the second side corresponding to the height of the projection.

Figure 25:
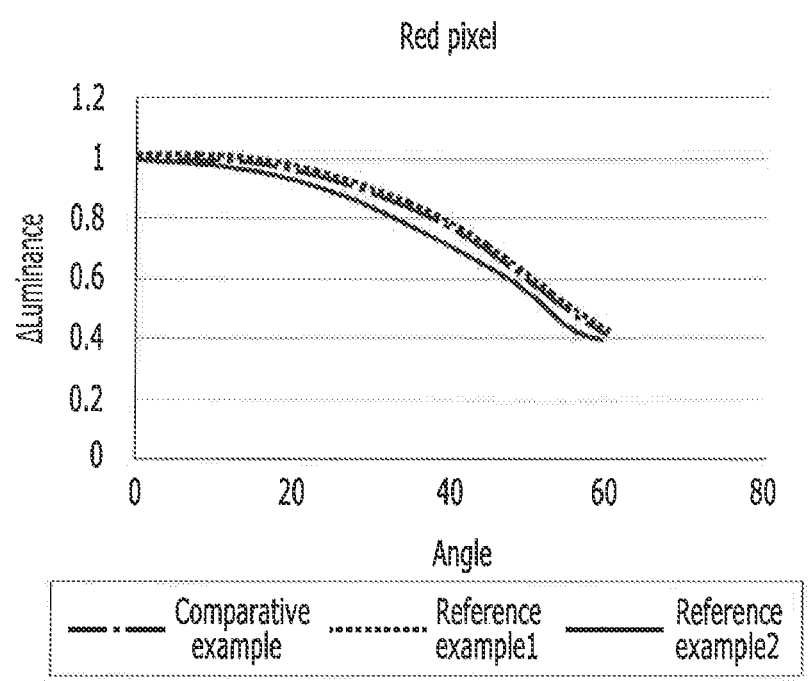
FIG. 25 is a graph showing a luminance change depending on a change of a viewing angle based on a front surface in a comparative example for an OLED without a projection and a reference example for an OLED having a projection of a symmetric structure in a bending display unit.

FIG. 25 is a graph showing a luminance change depending on a change of a viewing angle at a front surface in a comparative example for an OLED without a projection and Reference Examples 1 and 2 for an OLED having a projection of a symmetric structure in a bending display unit.

Referring to FIG. 25, a large difference for the luminance change measured depending on the viewing angle in the red pixel does not appear in the comparative example and Reference Example 1, however a slightly larger difference for the luminance change appears in Reference Example 2.

Figure 26:
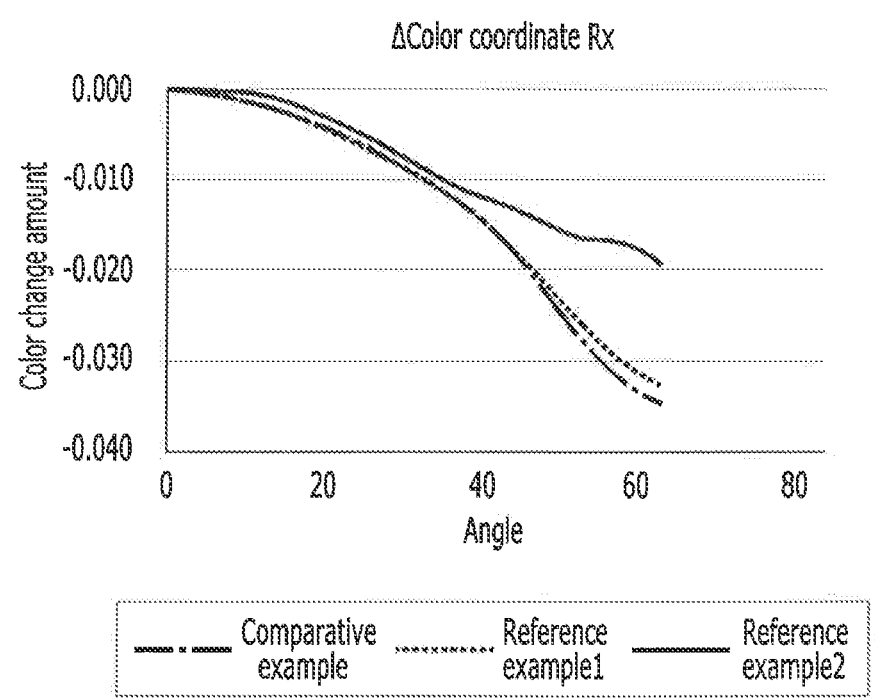
FIG. 26 is a graph showing a red color coordinate change amount depending on a change of a viewing angle based on a front surface in a comparative example for an OLED without a projection and a reference example for an OLED having a projection of a symmetric structure in a bending display unit.
Figure 27:
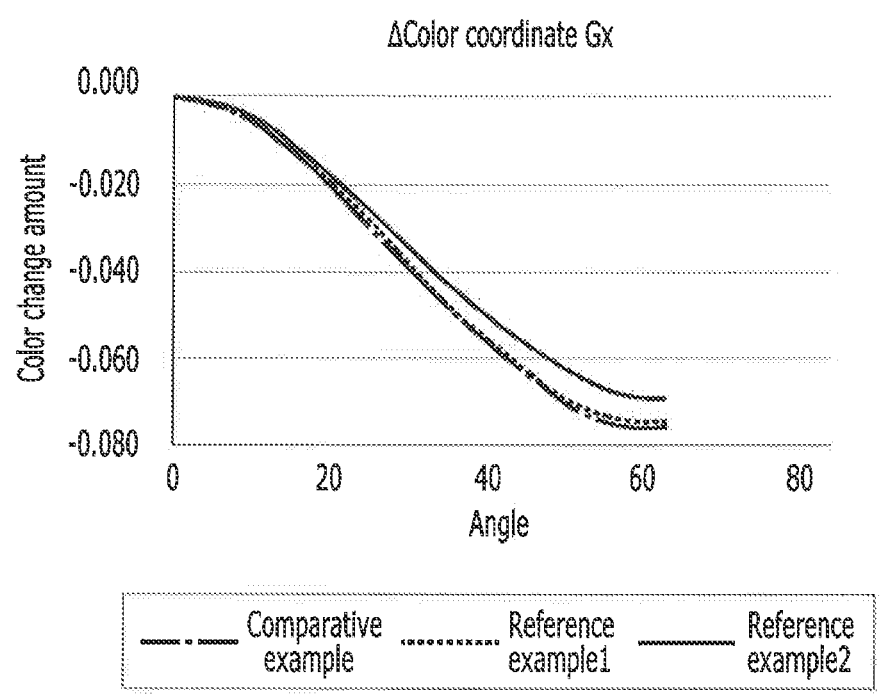
FIG. 27 is a graph showing a green color coordinate change amount depending on a change of a viewing angle based on a front surface in a comparative example for an OLED without a projection and a reference example for an OLED having a projection of a symmetric structure in a bending display unit.

FIG. 26 is a graph showing a red color coordinate change amount depending on a change of a viewing angle at a front surface in a comparative example for an OLED without a projection and Reference Examples 1 and 2 for an OLED having a projection of a symmetric structure in a bending display unit. FIG. 27 is a graph showing a green color coordinate change amount depending on a change of a viewing angle at a front surface in a comparative example for an OLED without a projection and Reference Examples 1 and 2 for an OLED having a projection of a symmetric structure in a bending display unit FIG. 28 is a graph showing a blue color coordinate change amount depending on a change of a viewing angle at a front surface in a comparative example for an OLED without a projection and Reference Examples 1 and 2 for an OLED having a projection of a symmetric structure in a bending display unit.

Figure 28:
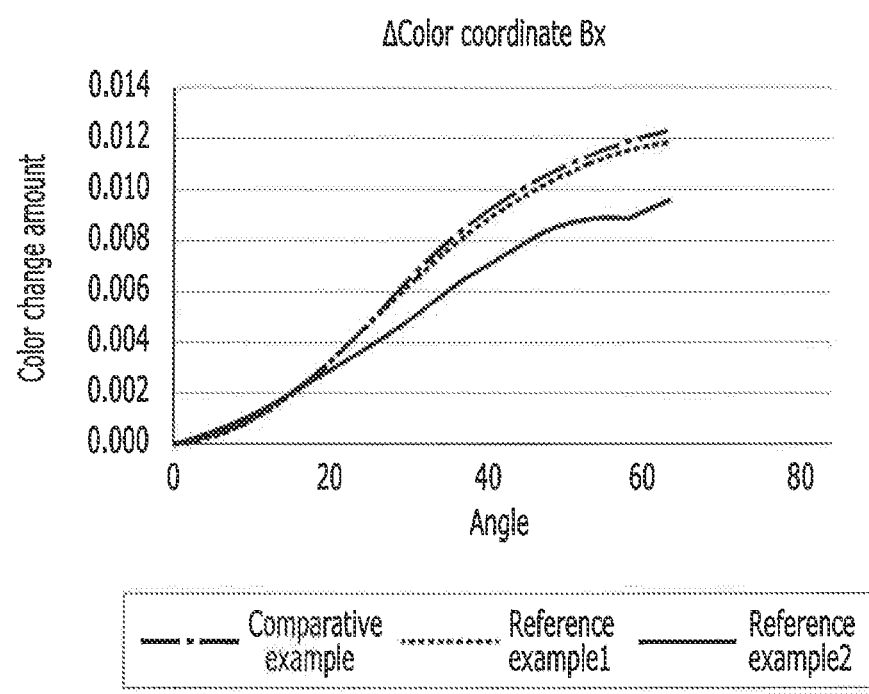
FIG. 28 is a graph showing a blue color coordinate change amount depending on a change of a viewing angle based on a front surface in a comparative example for an OLED without a projection and a reference example for an OLED having a projection of a symmetric structure in a bending display unit.

Referring to FIG. 26 to FIG. 28, it may be confirmed almost no difference exists for the color coordinate change amount in the comparative example and Reference Examples 1 and 2 in the viewing angle of 20 degrees or less, however as the viewing angle is increased, the color coordinate change amount is small in Reference Example 2 compared with the comparative example and Reference Example 1. In addition, comparing Reference Example 1 and Reference Example 2, even when the OLED has the projection of the symmetric structure, it may be confirmed that the angle of the projection is increased, and the color coordinate change amount is small.

Figure 29:
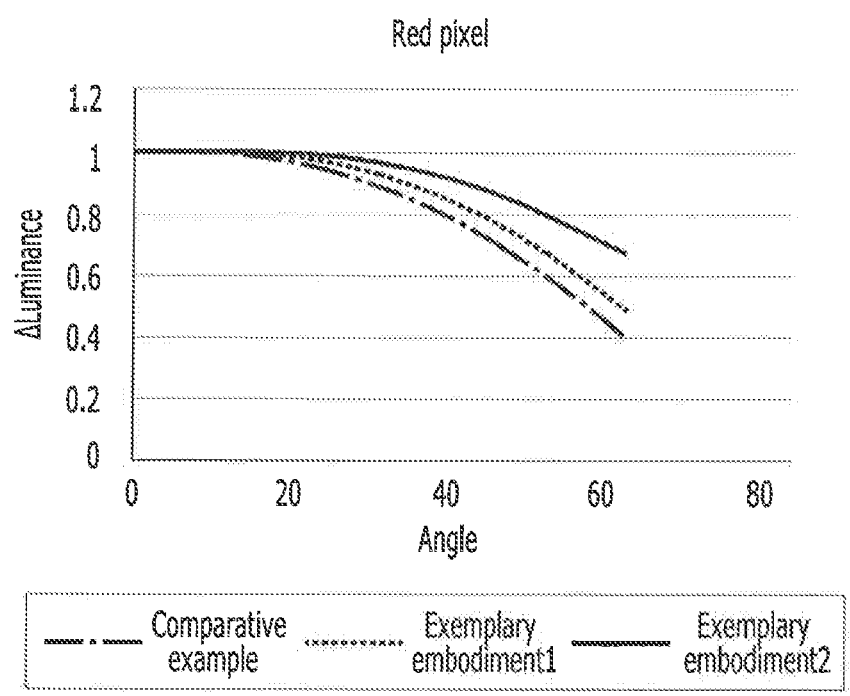
FIG. 29 is a graph showing a luminance change depending on a change of a viewing angle based on a front surface in a comparative example for an OLED without a projection and an exemplary embodiment of the present invention for an OLED having a projection of an asymmetric structure in a bending display unit.

FIG. 29 is a graph showing a luminance change depending on a change of a viewing angle at a front surface in a comparative example for an OLED without a projection and Exemplary Embodiments 1 and 2 for an OLED having a projection of an asymmetric structure in a bending display unit.

Referring to FIG. 29, the luminance change measured depending on the viewing angle in the red pixel is smaller in Exemplary Embodiment 1 compared with the comparative example and is smaller in Exemplary Embodiment 2 compared with Exemplary Embodiment 1. Compared with Reference Examples 1 and 2 described in FIG. 25, it may be confirmed that the luminance change is small in Exemplary Embodiments 1 and 2.

Figure 30:
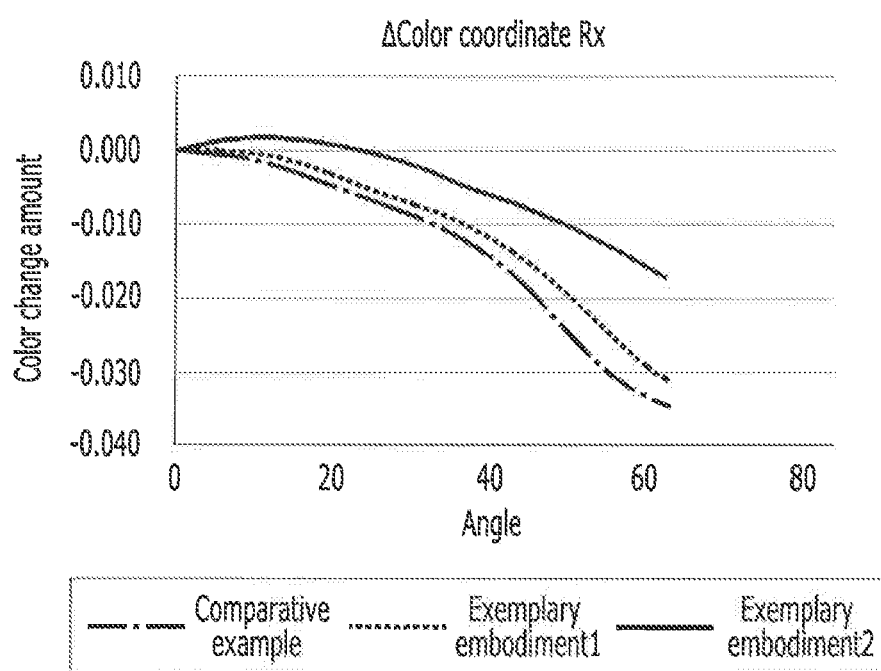
FIG. 30 is a graph showing a red color coordinate change amount depending on a change of a viewing angle based on a front surface in a comparative example for an OLED without a projection and an exemplary embodiment of the present invention for an OLED having a projection of an asymmetric structure in a bending display unit.
Figure 31:
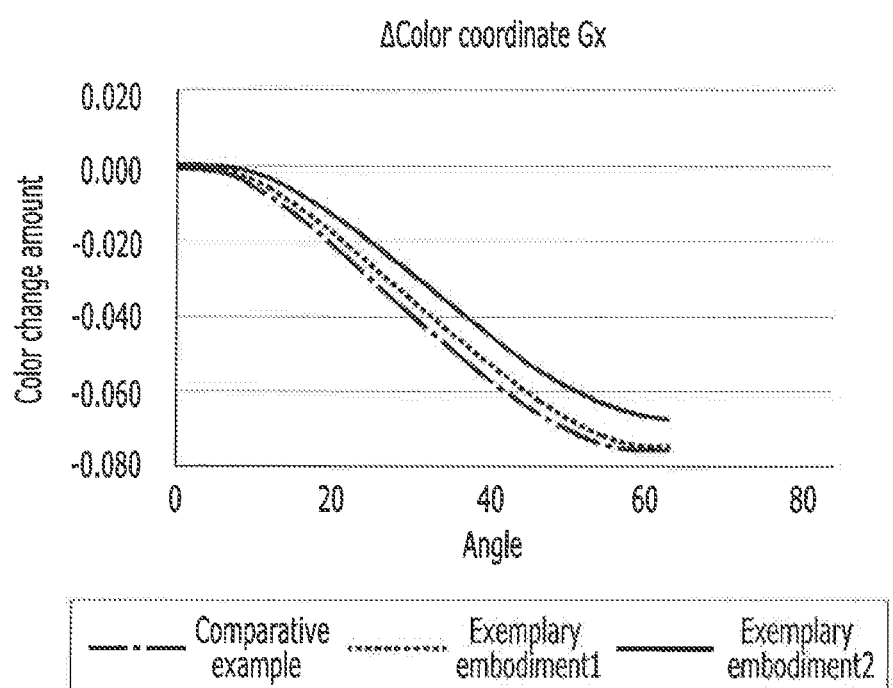
FIG. 31 is a graph showing a green color coordinate change amount depending on a change of a viewing angle based on a front surface in a comparative example for an OLED without a projection and an exemplary embodiment of the present invention for an OLED having a projection of an asymmetric structure in a bending display unit.
Figure 32:
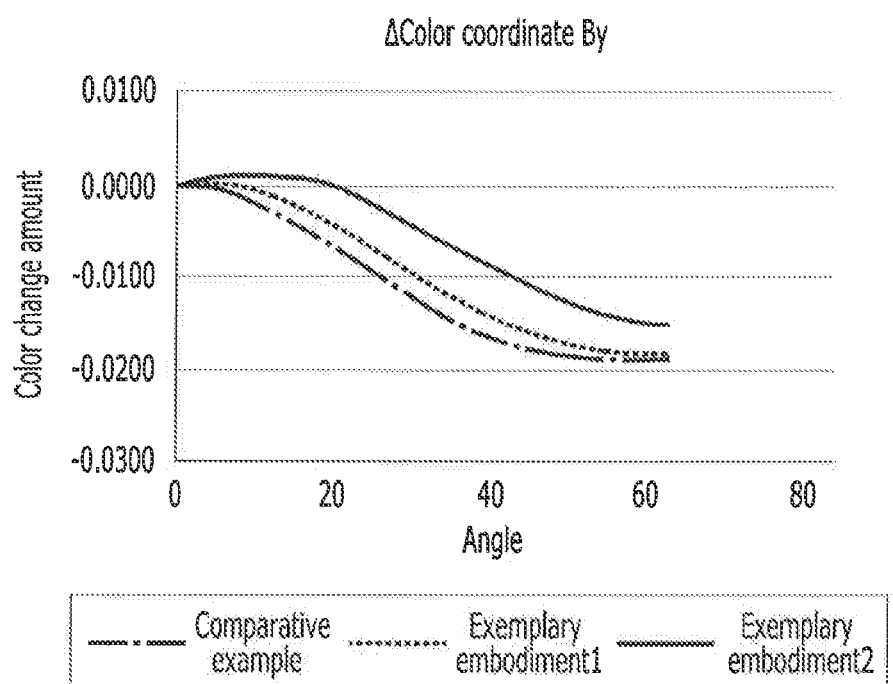
FIG. 32 is a graph showing a blue color coordinate change amount depending on a change of a viewing angle based on a front surface in a comparative example for an OLED without a projection and an exemplary embodiment of the present invention for an OLED having a projection of an asymmetric structure in a bending display unit.

FIG. 30 is a graph showing a red color coordinate change amount depending on a change of a viewing angle at a front surface in a comparative example for an OLED without a projection and Exemplary Embodiments 1 and 2 for an OLED having a projection of an asymmetric structure in a bending display unit FIG. 31 is a graph showing a green color coordinate change amount depending on a change of a viewing angle at a front surface in a comparative example for an OLED without a projection and Exemplary Embodiments 1 and 2 for an OLED having a projection of an asymmetric structure in a bending display unit. FIG. 32 is a graph showing a blue color coordinate change amount depending on a change of a viewing angle at a front surface in a comparative example for an OLED without a projection and Exemplary Embodiments 1 and 2 for an OLED having a projection of an asymmetric structure in a bending display unit.

Referring to FIG. 30 to FIG. 32, it may be confirmed that the color coordinate change amount is small in Exemplary Embodiments 1 and 2 compared with the comparative example in most viewing angles. In addition, comparing Exemplary Embodiment 1 and Exemplary Embodiment 2, even when the OLED has the projection of the asymmetric structure, the angle of the projection is increased, and it may be confirmed that the color coordinate change amount is small. As can be seen, the effect is larger as the angle of the projection is increased, however the electrical characteristic may worsen by the step (e.g., of a wiring line of a wiring layer) if the angle is very large. Thus, optimization may be required by considering the luminance change and the color coordinate change amount, as well as the electrical characteristic.

In an OLED display, as the observation angle of the observer is increased, when the observer is moved from the front of the display to the side, a color shift is generated such that a phenomenon in which a color is recognized as another color is generated. This phenomenon may worsen because of the curve due to the step of the wiring layer. Further, even if a clear color screen is realized at the front of the OLED display, as the observation angle is moved from the front to the side, the display quality may deteriorate due to the color shift phenomenon, however the OLED display according to an exemplary embodiment of the present invention may control the position of the wiring layer such that the WAD characteristic may be improved or smoothened by specifying the particular color. In other words, in an OLED display including a curved portion and a flat portion, a color quality difference between the flat portion and the curved portion recognized by users is minimized. In addition, process design for forming a conventional wiring layer is only changed by the present invention to control the position of the wiring layer such that an additional process is not required. This may reduce manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
a substrate;
a first insulating layer disposed on the substrate;
-layer a first wire, a second wire, and a driving connecting member disposed on the first insulating layer;
a second insulating layer covering the first wire, the second wire, and the driving connecting member;
a first electrode disposed on the second insulating layer;
a third insulating layer having an opening overlapping at least a part of the first electrode;
a light emitting layer overlapping the opening of the third insulating layer; and
a second electrode disposed on the light emitting layer and the third insulating layer,
wherein the driving connecting member does not overlap the opening: of the third insulating layer,
wherein the first wire and the second wire are symmetrically disposed with respect to a line passing through the middle of the opening in a plan view,
wherein the light emitting layer has a first projection above the first wire and a second projection above the second wire, the first projection and the second projection being symmetrically disposed with respect to a line passing through the middle of the opening.

2. The display device of claim 1, wherein
the first projection and the second projection which overlap the opening of the third insulating layer respectively are symmetrically disposed with respect to the line passing through the middle of the opening.

3. The display device of claim 2, wherein
the substrate has a curved portion and a flat portion, and the curved portion is bent and connected to a side of the flat portion.

4. The display device of claim 3, wherein
the first wire, the second wire, the first projection and the second projection are disposed in the flat portion.

5. The display device of claim 3, wherein
the first wire, the second wire, the first projection and the second projection are extended in a same direction.

6. The display device of claim 5, wherein
the driving connecting member is extended in the same direction.

7. The display device of claim 1, further comprising:
a first transistor electrically connected to the driving connecting member; and
a second transistor electrically connected to one of the first wire and the second wire.

8. The display device of claim 7, wherein
the first transistor and the second transistor are covered by the first insulating layer.

9. The display device of claim 8, wherein
the first transistor and the second transistor respectively comprise a gate electrode, a channel, a source and a drain, and the source and the drain are disposed at respective sides of the channel.

10. The display device of claim 9, wherein
the first wire or the second wire is connected to the source of the second transistor, and
the first wire, the second wire, and the driving connecting member are made of the same material.

11. The display device of claim 1, wherein
the first electrode includes pr6jections respectively corresponding to the first projection and the second projection.

12. The display device of claim 1, further comprising:
a third wire and a fourth wire disposed on the first insulating layer;
another first electrode disposed on the second insulating layer; and
another light emitting layer overlapping the another first electrode,
wherein the third insulating layer further includes another opening overlapping at least a part of the another first electrode,
wherein the second electrode is also disposed on the another light emitting layer,
wherein the third wire and the fourth wire are symmetrically disposed with respect to a line passing through the middle of the another opening in a plan view, and
wherein the another light emitting layer has a third projection above the third wire and a fourth projection above the fourth wire, the third projection and the fourth projection being symmetrically disposed with respect to a line passing through the middle of the another opening.

13. The display device of claim 12, wherein
the driving connecting member does not overlap the another opening of the third insulating layer.

14. The display device of claim 12, wherein
the driving connecting member is disposed between the second wire and the third wire, when the first wire, the second wire, the third wire, and the fourth wire are arranged in a direction.

15. The display device of claim 14, further comprising:
a first transistor electrically connected to the driving connecting member;
a second transistor electrically connected to one of the first wire and the second wire; and
a third transistor electrically connected to one of the third wire and the fourth wire.

16. The display device of claim 15, wherein
the first transistor, the second transistor, and the third transistor are covered by the first insulating layer.

17. The display device of claim 16, wherein
the first transistor, the second transistor, and the third transistor respectively comprise a gate electrode, a channel, a source and a drain, and the source and the drain are disposed at respective sides of the channel.

18. The display device of claim 17, wherein
the first wire or the second wire is connected to the source of the second transistor,
the third wire or the fourth wire is connected to the source of the third transistor, and
the first wire, the second wire, the third wire, the fourth wire, and the driving connecting member are made of the same material.

19. The display device of claim 14, wherein
the first electrode includes projections respectively corresponding to the first projection and the second projection, and
the another first electrode includes projections respectively corresponding to the third projection and the fourth projection.

\* \* \* \* \*

UNITED STATES PATENT AND TRADEMARK OFFICE
CERTIFICATE OF CORRECTION

| | | |
|---|---|---|
| PATENT NO. | : 11,895,875 B2 | Page 1 of 1 |
| APPLICATION NO. | : 17/530599 | |
| DATED | : February 6, 2024 | |
| INVENTOR(S) | : Kwon et al. | |

It is certified that error appears in the above-identified patent and that said Letters Patent is hereby corrected as shown below:

In the Claims

In Line 4 of Claim 1, please delete "-layer" before "a first wire"

Signed and Sealed this
Tenth Day of December, 2024

Katherine Kelly Vidal
*Director of the United States Patent and Trademark Office*